(12) United States Patent
Sadohara et al.

(10) Patent No.: US 7,875,116 B2
(45) Date of Patent: Jan. 25, 2011

(54) SILICON SINGLE CRYSTAL PRODUCING METHOD, ANNEALED WAFER, AND METHOD OF PRODUCING ANNEALED WAFER

(75) Inventors: Shinya Sadohara, Omura (JP); Ryota Suewaka, Omura (JP); Shiro Yoshino, Omura (JP); Kozo Nakamura, Omura (JP); Yutaka Shiraishi, Omura (JP); Syunji Nonaka, Omura (JP)

(73) Assignee: Sumco Techxiv Corporation, Nagasaki (JP)

( * ) Notice: Subject to any disclaimer, the term of this patent is extended or adjusted under 35 U.S.C. 154(b) by 318 days.

(21) Appl. No.: 11/887,244

(22) PCT Filed: Feb. 14, 2006

(86) PCT No.: PCT/JP2006/302517

§ 371 (c)(1),
(2), (4) Date: Sep. 26, 2007

(87) PCT Pub. No.: WO2006/103837

PCT Pub. Date: Oct. 5, 2006

(65) Prior Publication Data
US 2009/0061140 A1 Mar. 5, 2009

(30) Foreign Application Priority Data
Mar. 28, 2005 (JP) .............................. 2005-092928

(51) Int. Cl.
*C30B 15/20* (2006.01)
(52) U.S. Cl. .............................. 117/13; 117/15; 117/17; 117/18; 117/20; 117/8
(58) Field of Classification Search ................... 117/13, 117/15, 17, 18, 20, 5, 8, 9
See application file for complete search history.

(56) References Cited

U.S. PATENT DOCUMENTS 6,191,009 B1 * 2/2001 Tamatsuka et al. .......... 438/471

(Continued)

FOREIGN PATENT DOCUMENTS

EP 0829559 A1 3/1998

(Continued)

OTHER PUBLICATIONS

Search Report dated Apr. 18, 2006, for PCT/JP/2006/302517 (translation).

(Continued)

*Primary Examiner*—Robert M Kunemund
(74) *Attorney, Agent, or Firm*—Husch Blackwell Welsh Katz

(57) ABSTRACT

A method in which SSDs are reliably reduced while reducing void defects other than the SSDs on a wafer surface, which is essential for an annealed wafer, and ensuring that BMDs serving as gettering source in a bulk are generated, in order to stabilize the quality of the annealed wafer. Considering that annealing a silicon wafer leads to an increase of density (quantity) of deposits associated with oxygen and nitrogen and forming a core of the SSDs, SSDs are decreased by reducing the density (quantity) of the deposits associated with oxygen and nitrogen by controlling three parameters of oxygen concentration, nitrogen concentration and cooling concentration during the process of pulling and growing the silicon single crystal 6 before annealing. Alternatively, SSD is reduced by polishing after annealing.

8 Claims, 16 Drawing Sheets

U.S. PATENT DOCUMENTS

| | | | |
|---|---|---|---|
| 6,299,982 B1 * | 10/2001 | Tamatsuka et al. | 428/446 |
| 6,805,742 B2 * | 10/2004 | Tachikawa et al. | 117/30 |
| 2004/0194692 A1 | 10/2004 | Nishikawa et al. | |

FOREIGN PATENT DOCUMENTS

| | | |
|---|---|---|
| EP | 1195455 A1 | 4/2002 |
| EP | 1513193 A1 | 3/2005 |
| JP | 2000-281490 | 10/2000 |
| JP | 2000-290100 | 10/2000 |
| JP | 2002-012497 | 1/2002 |
| JP | 2002-246396 | 8/2002 |
| JP | 2003-109961 | 4/2003 |
| JP | 2004-111732 | 4/2004 |
| JP | 2004-119446 | 4/2004 |

OTHER PUBLICATIONS

German Office Action for related patent application issued Dec. 22, 2009 with English translation.

* cited by examiner

GENERAL VIEW OF CZ FURNACE
EMPLOYING COOLING JACKET

4 PULLING MECHANISM
7 ARGON GAS
8 HEAT SHIELD PLATE
11 GRAPHITE CRUCIBLE
13 HEAT-INSULATING CYLINDER
10 ROTARY SHAFT

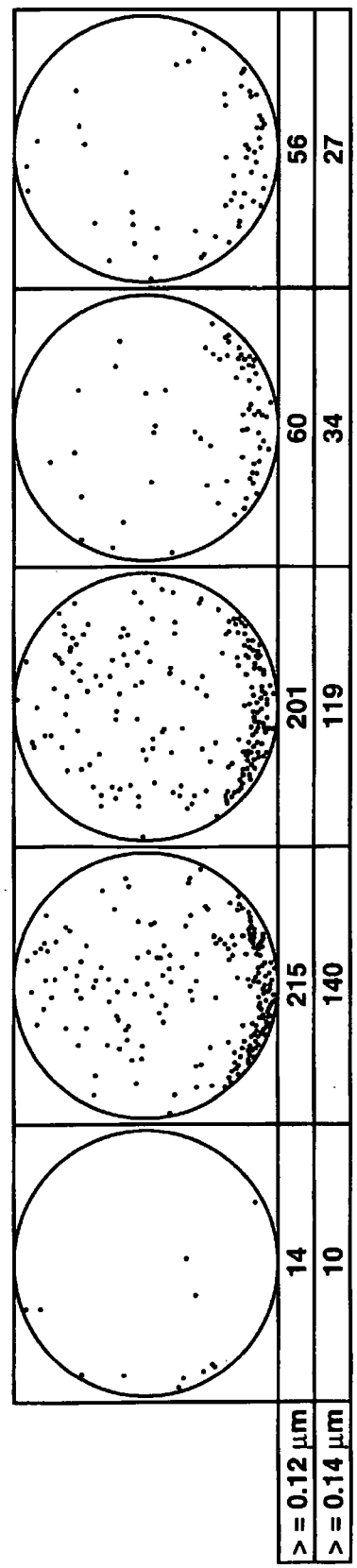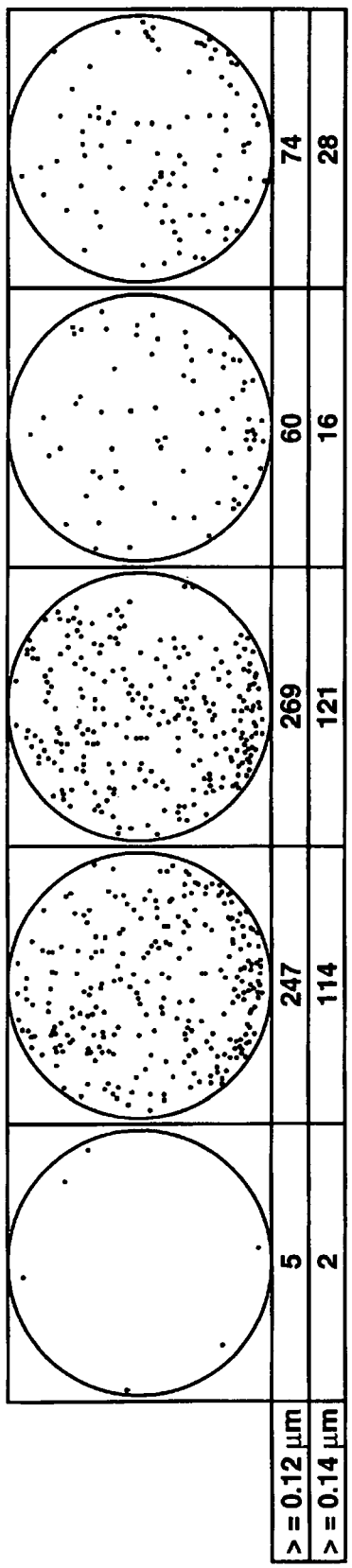

| GROUP | COOLING RATE (°C/min) | OXYGEN CONCENTRATION (×E17 atoms/cm³) | NITROGEN CONCENTRATION (×E14 atoms/cm³) |
|---|---|---|---|
| A | 0.27~0.33 | 11.2~13.4 | 0.7~1.2 |
| B | 0.40~0.44 | 11.4~12.5 | 0.6~0.7 |
| C | 0.73~0.77 | 9.3~11.4 | 1.1~1.3 |
| D | 0.38~0.42 | 14.0~15.0 | NOT DOPED WITH NITROGEN |

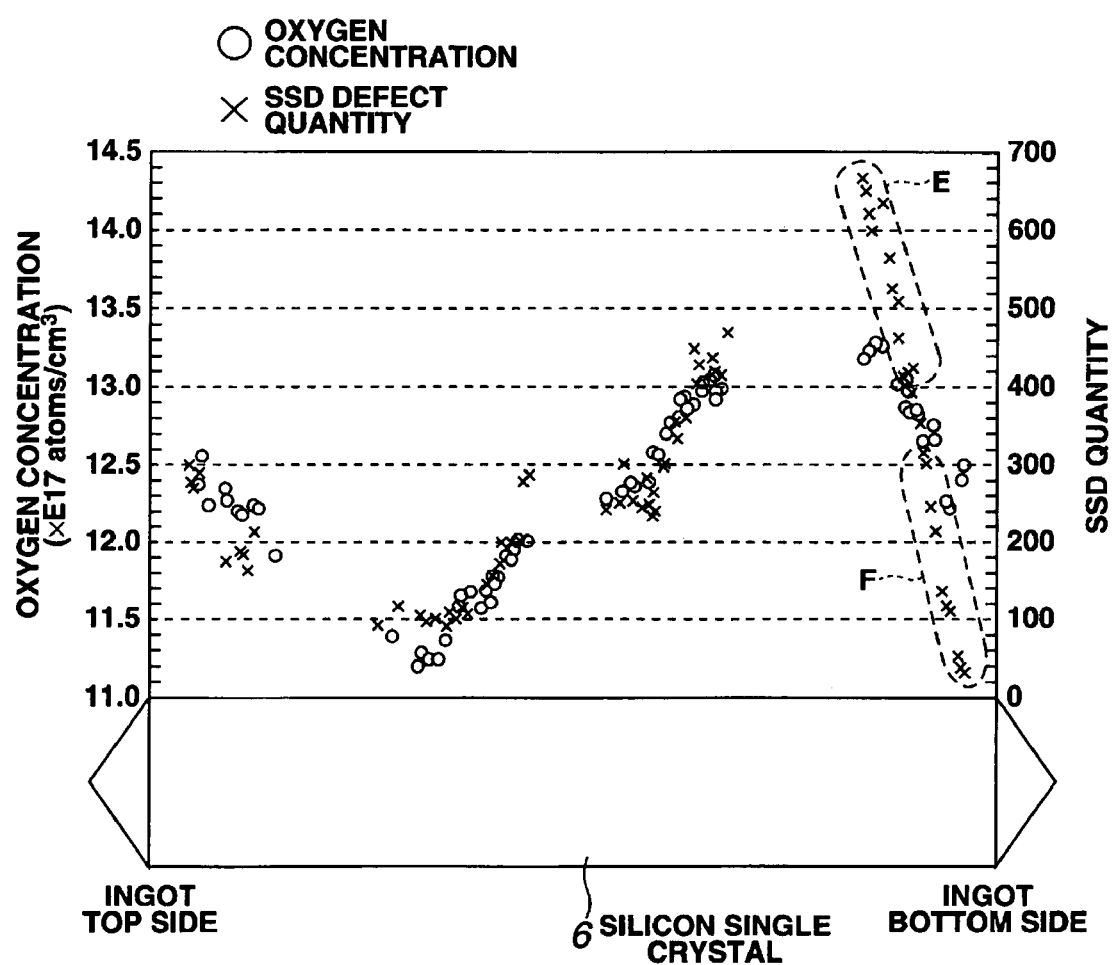

MAGICS MEASUREMENT

AFM MEASUREMENT

SSD DEFECT SHAPE MEASURED BY AFM
WIDTH: 0.5 TO 2.5 μm
DEPTH: 2 TO 5 nm

FIG.16

COMPARISON EXAMPLE BETWEEN ESTIMATED AND ACTUAL SSD VALUES

| TEST NUMBER | CRYSTAL COOLING RATE AT 950°C (°C/min) | OXYGEN CONCENTRATION (×E17 atoms/cm$^3$) | NITROGEN CONCENTRATION (×E13 atoms/cm$^3$) | ACTUAL SSD DENSITY (units/cm$^2$) | ESTIMATED SSD DENSITY (units/cm$^2$) | |
|---|---|---|---|---|---|---|
| No. 1 | 0.29 | 12.40 | 9.9 | 0.40 | 0.54 | EXAMPLE |
| No. 2 | 0.42 | 11.70 | 5.0 | 0.10 | 0.07 | EXAMPLE |
| No. 3 | 0.75 | 11.41 | 10.8 | 0.06 | 0.06 | EXAMPLE |
| No. 4 | 0.35 | 11.64 | 6.8 | 0.10 | 0.14 | EXAMPLE |
| No. 5 | 0.32 | 13.77 | 12.6 | 1.94 | 1.62 | COMPARATIVE EXAMPLE |
| No. 6 | 0.37 | 12.13 | 6.2 | 0.16 | 0.16 | COMPARATIVE EXAMPLE |
| No. 7 | 0.72 | 13.84 | 32.3 | 1.59 | 1.45 | COMPARATIVE EXAMPLE |
| No. 8 | 0.27 | 13.63 | 13.3 | 2.48 | 2.12 | COMPARATIVE EXAMPLE |

SILICON SINGLE CRYSTAL PRODUCING METHOD, ANNEALED WAFER, AND METHOD OF PRODUCING ANNEALED WAFER

CROSS-REFERENCE TO RELATED APPLICATION

This application claims priority of PCT/JP2006/302517, filed Feb. 14, 2006, and Japanese Patent Application No. JP 2005-092928 filed on Mar. 28, 2005.

TECHNICAL FIELD

The present invention relates to a method of producing a silicon single crystal or an annealed wafer, capable of reducing the density (or quantity) of SSDs (Surface Shallow Defects, or very wide and shallow recessed defects) on the annealed wafer surface, or an annealed wafer in which the density (or quantity) of SSDs is reduced.

BACKGROUND ART

A silicon single crystal is produced by pulling up and growing using the CZ (Czochralski) method. An ingot of the pulled-up and grown silicon single crystal is sliced into silicon wafers. A semiconductor device is fabricated through a device process in which a device layer is formed on the surface of a silicon wafer.

However, a crystal defect referred to as the "grown-in defect" (defect incurred during the crystal growth) occurs in the course of the growth of a silicon single crystal.

Recently, as the semiconductor circuit becomes more dense and fine, the presence of such grow-in defects has become intolerable in the vicinity of a surface layer of a silicon wafer where a device is fabricated. Thus, studies are being conducted on the possibility of producing a defect-free crystal.

In general, there are the following three types of crystal defects which may be included in a silicon single crystal and deteriorate device characteristics.

i) Void defect generated by aggregation of vacancies and referred to as COP (Crystal Originated Particles) or the like
ii) OSF (Oxidation Induced Stacking Fault)
iii) Dislocation loop clusters generated by aggregation of interstitial silicon (also known as interstitial silicon dislocation defects, or I-defects)

A defect-free silicon single crystal is recognized or defined as a crystal not including or substantially not including any of the three types of defects.

It is known that the generation behaviors of the above-mentioned three types of defects vary as described below depending on growth conditions. Description will be made with reference to FIG. 1. In FIG. 1, the horizontal axis represents the growth condition V/G (V denotes a growth rate, and G denotes temperature gradient in the axial direction in the vicinity of the melting point of a silicon single crystal). Assuming that G is fixed, G can be considered as a function of the growth rate V. The vertical axis in FIG. 1 represents the point defect concentration.

i) When the growth rate V is high, the silicon single crystal will have an excess of vacancy point defects, and only void defects will occur.

ii) When the growth rate V is decreased, ring-shaped OSFs (R-OSFs) occur near the outer periphery of the silicon single crystal 10, resulting in a structure in which void defects are present in the inside of the R-OSF portion.

iii) When the growth rate V is decreased further, the radius of the ring-shaped OSFs (R-OSFs) will decrease, resulting in a structure in which a region that does no contain the defects is formed in the outside of the ring-shaped OSFs, and void defects are present in the inside of the R-OSF portion.

iv) When the growth rate V is decreased even further, the resulting structure is such that dislocation loop clusters are present in the entire silicon single crystal.

The reason why the above-mentioned phenomena occur is believed to be that as the growth rate V decreases, the silicon single crystal changes from a state of excess of vacancy point defects to a state of excess of interstitial silicon point defects, and this change is understood to start from the outer periphery of the silicon single crystal.

In FIG. 1, the regions where the void defects are present at high density are referred to as the "V-rich region" (vacancy point defect rich region) and the "I-rich region" (interstitial point defect rich region).

Of the above three types of defect, the void defects in particular constitute a cause of device isolation failure in very small devices, so there is a particular need to reduce such defects.

The void defects are produced when atomic vacancies (point defects) incorporated from a silicon melt during crystal growth agglomerate as a result of reaching a critical super-saturation during crystal cooling, and are called LPD (laser particle defect), COP (crystal oriented particle), FPD (flow pattern defect), LSTD (laser scattering tomography defect), and so forth depending on methods for detecting such defects.

A defect-free silicon single crystal is recognized or defined as a crystal not including, or substantially not including any of the above three types of defects.

There have been proposed methods as follows to obtain a silicon wafer including no grow-in defect near the surface layer where a device circuit is to be fabricated.

i) To manufacture a defect-free single crystal ingot by controlling crystal growth conditions
ii) To vanish void defects near the wafer surface layer by high-temperature annealing
iii) To form a defect-free layer on the wafer surface by epitaxial growth Among these methods, the method to vanish void defects near the wafer surface layer by high-temperature annealing is already a well known technique. Specifically, according to this method, a silicon wafer is obtained from a silicon single crystal grown under ordinary growth conditions and including void defects, and the obtained wafer is subjected to a thermal treatment at a high temperature for long period of time to thereby vanish void defect near the surface layer (hereinafter, the wafer shall be referred to as the "annealed wafer").

Additionally, an oxygen deposit referred to as BMD (bulk micro defect) is generated during a thermal treatment in device manufacturing processes. Control of the BMD generation constitutes an important problem in the manufacture of a silicon wafer. Specifically, any BMDs formed near the surface layer where a device circuit is to be fabricated will impair the functions of the device.

On the other hand, the presence of any heavy metal impurity such as Fe or Cu in a surface layer portion of a silicon wafer will deteriorate device characteristics when the device is fabricated. This makes it necessary to form a gettering site for capturing the heavy metal within the bulk of the silicon wafer. The BMD generated within the bulk of the silicon wafer will effectively act as the gettering (intrinsic gettering) source for capturing the heavy metal.

FIG. 2 schematically shows a cross-sectional structure of an annealed wafer.

As seen from the description above, it is necessary for the manufacture of an annealed wafer 100 as shown in FIG. 2 to form, within the wafer 100, an intrinsic gettering site having BMDs at a high density of approximately $10^8$ unit/cm$^3$ or more, while forming a defect-free layer including no BMDs nor grow-in defects such as COP as described above, namely a DZ layer, in the surface layer where a device is to be fabricated (with a depth of 10 μm or more). Thus, there is a strong demand for achieving easy commercial manufacture of such annealed wafers.

The COP or BMD density is affected by an oxygen concentration within a silicon single crystal. Therefore, the oxygen concentration within a silicon single crystal constitutes an important factor in manufacturing an ideal annealed wafer.

In order to facilitate the elimination of COPs generated by the annealing treatment, a method is taken of doping the silicon single crystal with nitrogen to reduce the initial size of the COPs. This is described in Patent Document 2. The nitrogen doping also makes it possible to produce an increased quantity of BMDs.

In this manner, the size of the COPs and the quantity of the BMDs are affected by a nitrogen concentration.

In order to manufacture an ideal annealed wafer as described above, the control of the oxygen concentration and the nitrogen concentration within the silicon single crystal forming a substrate thereof constitutes an important factor.

A method is also known of reducing the amount of vacancies incorporated in the silicon single crystal and reducing the COP size by decreasing the pulling growth rate, or reducing the ratio V/G between the pulling rate V and the temperature gradient G in the vicinity of the melting point, in the course of growth of the crystal.

When a silicon wafer with a diameter of 200 mm is manufactured, the crystal can be pulled at a very high rate. As the pulling rate is increased, the cooling rate of the silicon single crystal is also increased, and the residence time in a temperature range in which COPs are formed is shortened, resulting in reduction of the COP size.

However, when a silicon wafer with a diameter of 300 mm is manufactured, the heat capacity of a silicon ingot is increased, and hence the cooling rate of the silicon single crystal cannot be increased enough to reduce the COP size.

Therefore, when manufacturing a silicon wafer with a diameter of 300 mm, a method is taken of conversely reducing the pulling rate, setting various conditions and then reducing the COP size.

More specifically, referring to FIG. 1, a silicon single crystal with a diameter of 300 mm is often pulled under crystal growth conditions corresponding to a V/G region overlapping with an R-OSF region. In this low V/G region, the quantity of vacancies incorporated in the silicon single crystal is reduced, and hence the size and density of the COPs can be reduced. This makes it easy to eliminate the COPs generated by annealing. However, the silicon single crystal thus obtained is a slow cooling type crystal that is to be cooled slowly.

It has conventionally been believed that an ideal annealed wafer 100 as shown in FIG. 2 can be easily manufactured commercially by taking the methods as described above.

Recently, however, a defect called DNN defect having a different origin from the void defect (COP) has been found in the surface layer of an annealed wafer.

The DNN defect means a wafer surface defect that is detected by measurement in the DNN (dark-field normal narrow) mode using a commercially available Particle Counter SP1 (instrument made by KLA-Tencor). The DNN mode is a mode in which laser light is applied vertically to the wafer and then collected in a portion close to regular reflection to observe the diffuse reflection due to defects. The DNN mode is particularly effective to detect foreign particles and pits (depressions) on the wafer surface.

Patent Document 1, which is described later, discloses an invention according to which DNN defects are reduced by performing hydrofluoric acid cleaning prior to annealing in order to dissolve oxygen deposits which serve as cores of DNN defects and is generated after annealing.

Patent Document 1 also describes the following findings about relationship among DNN defects, oxygen concentration, nitrogen concentration, and crystal growth conditions.

1) There is described a finding that the quantity of DNN defects is increased as the oxygen concentration in a silicon single crystal is increased (Patent Document 1, paragraph (0023)).

2) There is described a finding that a greater quantity of DNN defects are generated in an annealed wafer containing nitrogen than in an annealed wafer containing no nitrogen (Patent Document 1, paragraph (0020)).

3) There is described a finding that many DNN defects are generated when a silicon single crystal is pulled and grown under crystal growth conditions corresponding to a region where OSFs tend to occur, and therefore the generation of DNN defects can be reduced by pulling and growing the silicon single crystal under crystal growth conditions corresponding to a region where less OSFs occur, while avoiding the region where OSFs tend to occur (Patent Document 1, paragraph (0057)).

Patent Document 1: Japanese Patent application Laid-Open No. 2004-119446

Patent Document 2: Japanese Patent No. 3479001

DISCLOSURE OF THE INVENTION

Problems to be Solved by the Invention

As described later, the present inventors have found that very wide and shallow recessed defects are generated on the surface of a nitrogen doped annealed wafer. Hereafter, such defects shall be defined as "SSDs" (Surface Shallow Defects) meaning "very wide and shallow recessed defects on a surface". The SSDs are defects that have been made detectable by measurement in the DNN mode using the above-mentioned Particle Counter SP1 from KLA-Tencor. In that sense, the SSDs fall into the category of the DNN defect disclosed in the above-mentioned Patent Document 1. Consequently, description will be made of problems not solved by Patent Document 1, while replacing the "DNN defects" disclosed in Patent Document 1 with the "SSDs" discovered by the present inventors.

Specifically, none of the followings is described in the above-mentioned Patent Document 1:

a) Specific and quantitative values of oxygen concentration and nitrogen concentration required for reducing the quantity of SSDs;

b) Specific parameters other than oxygen concentration and nitrogen concentration causing generation of SSDs; and c) Degree of dependency and relationship between the parameters causing generation of SSDs.

This makes it impossible to accurately estimate or control the quantity of SSDs generated during manufacture of an annealed wafer, resulting in problems such as variation in quality of the annealed wafer. For example, a countermeasure of reducing only the oxygen concentration may be envisaged from the above-mentioned finding 1) in the Patent Document 1. However, if only the oxygen concentration is simply reduced, a new problem such as increased slipping tendency on the annealed wafer will be induced. This is mentioned also in Patent Document 1 (Patent Document 1, paragraph (0024)). If the matters of a), b), and c) above are known, it will be possible to estimate the oxygen concentration that reduces the quantity of SSDs to a desired value while causing no such problems as slip, and thus to stabilize the quality of the annealed wafer.

Likewise, a countermeasure of not adding nitrogen to a silicon single crystal or minimizing the nitrogen doping amount may be envisaged from the above-mentioned finding 2) of the Patent Document 1. However, such simple measures as omission of adding nitrogen or minimization of the nitrogen doping amount in the silicon single crystal will impair the advantages obtainable by nitrogen doping, resulting in new problems that the COP size is increased and a large quantity of BMDs cannot be generated as the gettering sites. If the matters of a), b), and c) above are known, it will be possible to estimate the nitrogen concentration that reduces the quantity of SSDs to a desired value, while reducing the COP size and enabling formation of many BMDs as the gettering sites, and to stabilize the quality of the annealed wafer.

In order to produce an annealed wafer with a diameter of 300 mm, as described above, it is believed desirable to pull and grow a silicon single crystal under crystal growth conditions corresponding to the "low V/G region".

However, the "low V/G region" overlaps with the "region where OSFs tend to occur" as described in the finding 3) of Patent Document 1 (see FIG. 1), and is a region to be avoided (part of the "low V/G" region is an R-OSF region). Therefore, according to the finding 3) of Patent Document 1, a silicon single crystal with a diameter of 300 mm has to be pulled and grown in a region avoiding the "low V/G region". Thus, the "low V/G region" that is believed desirable for production of the annealed wafer cannot be used effectively.

Even if a silicon single crystal is pulled and grown under the crystal growth conditions corresponding to the "region where less OSFs occur", while avoiding the "region where OSFs tend to occur according to Patent Document 1, there is no assurance that the SSDs can be reduced effectively, since the above-mentioned findings a), b), and c) are not known.

The present invention has been made in view of the circumstances as described above. It is an object of the invention to stabilize the quality of annealed wafers by reliably reducing SSDs while ensuring reduction of void defects other than SSDs in the wafer surface indispensable for the annealed wafer, and generation of BMDs as a gettering source in bulk.

Means for Solving the Problems

A first aspect of the invention relates to a silicon single crystal producing method for decreasing SSDs (Surface Shallow Defects, or very wide and shallow recessed defects) generated on the surface of a wafer subjected to an annealing treatment, in which deposits associated with oxygen and nitrogen and forming cores of the SSDs are decreased by controlling three parameters of oxygen concentration, nitrogen concentration, and cooling rate in a predetermined temperature range when pulling a silicon single crystal from a melt.

A second aspect of the invention relates to a silicon single crystal producing method in which: the density or quantity of SSDs (Surface Shallow Defects, or very wide and shallow recessed defects) generated on the surface of a wafer subjected to an annealing treatment is estimated by using a relational expression established among a density or quantity of the SSDs, oxygen concentration within the silicon single crystal, nitrogen concentration within the silicon single crystal, and cooling rate at a predetermined temperature during the pulling of the silicon single crystal; and the silicon single crystal is pulled under such crystal growth conditions of the oxygen concentration, the nitrogen concentration, and the cooling rate in the predetermined temperature range that the estimated SSD density or quantity is obtained.

A third aspect of the invention relates to the silicon single crystal producing method according to the first and second aspects of the invention, in which the relational expression established among oxygen concentration, nitrogen concentration, and cooling rate in a predetermined temperature range is represented by:

$$N_{ssd}=A[Oi]^l[N]^m[CR]^n \text{ (where } l>0, m>0, \text{ and } n<0\text{)}$$

when the SSD density or quantity is denoted by Nssd, the oxygen concentration by Oi, the nitrogen concentration by N, the cooling rate in the predetermined temperature range by CR, and A denotes a constant.

A fourth aspect of the invention relates to a silicon single crystal producing method, wherein a silicon single crystal having a diameter of 300 mm or greater is pulled with the nitrogen doping amount set in a range of 1E13 to 2.5E14 atoms/cm$^3$, the solution oxygen concentration set in a range of 11E17 to 14E17 atoms/cm$^3$, and the cooling rate in a temperature range of 900° C. to 1000° C. set to 2.5° C./min or higher.

A fifth aspect of the invention relates to a silicon single crystal producing method, wherein a silicon single crystal having a diameter of 300 mm or greater is pulled with the nitrogen doping amount set in a range of 1E13 to 2.5E14 atoms/cm$^3$, the solution oxygen concentration set in a range of 11E17 to 14E17 atoms/cm$^3$, and the cooling rate in a temperature range of 900° C. to 1000° C. set to 1.5° C./min or higher.

A sixth aspect of the invention relates to a silicon single crystal producing method, wherein a silicon single crystal having a diameter of 300 mm or greater is pulled while controlling a cooling rate such that the cooling rate in a temperature range of 900° C. to 1000° C. is 4.2° C./min or higher when the nitrogen concentration is 5E14 atoms/cm$^3$ or lower and the oxygen concentration is 14E17 atoms/cm$^3$ or lower.

A seventh aspect of the invention relates to a silicon single crystal producing method, wherein a silicon single crystal having a diameter of 300 mm or greater is pulled while controlling a cooling rate such that the cooling rate in a temperature range of 900° C. to 1000° C. is 2.8° C./min or higher when the nitrogen concentration is 5E14 atoms/cm$^3$ or lower and the oxygen concentration Oi is 14E17 atoms/cm$^3$ or lower.

An eighth aspect of the invention relates to the silicon single crystal producing method according to the third aspect of the invention, wherein a cooling rate CR is obtained from the equation in Claim 3 such that the SSD density or quantity Nssd becomes equal to or less than a desired value when the nitrogen concentration N is 5E14 atoms/cm$^3$ or lower and the oxygen concentration Oi is 14E17 atoms/cm$^3$ or lower; and a silicon single crystal is pulled while controlling the cooling rate to be the obtained cooling rate CR.

A ninth aspect of the invention relates to the silicon single crystal producing method according to any one of the first to eighth aspects of the invention, wherein cooling means for cooling a silicon single crystal is provided within a furnace in which processing to pull the silicon single crystal from a melt is performed, and the cooling rate is controlled by using the cooling means.

An tenth aspect of the invention relates to an annealed wafer obtained by subjecting a silicon wafer obtained from a silicon single crystal produced by the method of the ninth aspect of the invention to an annealing treatment, wherein, when a surface of the annealed wafer is inspected by DNN-mode measurement with the use of Particle Counter SP1 instrument made by KLA-Tencor, the density of SSDs having a diameter of 140 nm or greater thereby detected is 0.15/cm² or lower.

An eleventh aspect of the invention relates to an annealed wafer wherein the density of SSDs (Surface Shallow Defects, or very wide and shallow recessed defects) having a diameter of 140 nm or greater is 0.15/cm² or lower when a surface of the annealed wafer is inspected by DNN-mode measurement with the use of Particle Counter SP1 instrument made by KLA-Tencor; and when the surface of the annealed wafer is polished to a depth of at least 1 μm, the density of defects having a diameter of 140 nm or greater detected by the DNN-mode measurement using the SP1 instrument is decreased to 0.04/cm² or lower.

A twelfth aspect of the invention relates to an annealed wafer doped with nitrogen, wherein, when a surface of the wafer is inspected by DNN-mode measurement with the use of Particle Counter SP1 instrument made by KLA-Tencor, the density of SSDs (Surface Shallow Defects, or very wide and shallow recessed defects) having a diameter of 140 nm or greater thereby detected is 0.04/cm² or lower.

A thirteenth aspect of the invention relates to an annealed wafer producing method including the steps of: annealing a nitrogen-doped silicon wafer; and polishing the annealed wafer surface to a depth of at least 1 μm from the surface.

The present inventors have obtained the following findings based on results of experiments and simulations.

a) Specific and quantitative values of oxygen concentration Oi and nitrogen concentration N required to decrease the quantity of SSDs Nssd;

b) Specific parameters other than oxygen concentration Oi and nitrogen concentration N causing generation of SSDs (a cooling rate CR in a predetermined temperature range); and c) Degree of dependency and relationship between the parameters causing generation of SSDs (the above-mentioned equation, FIGS. 9 to 12)

Further, the present inventors have obtained findings as follows.

d) DNN defects detected on a surface of a nitrogen-doped annealed wafer are very shallow and wide defects recessed into the wafer surface (SSDs).

e) The SSDs have no adverse effects on oxide film dielectric breakdown characteristics.

f) The SSDs are exposed after anneal regardless of annealing atmosphere.

g) The SSDs are locally present in a very superficial portion of the surface of an annealed wafer and thus can be substantially vanished by polishing the wafer surface to a depth of at least 1 μm.

In view of the findings above, the present inventors have recognized that annealing of a silicon wafer would increase the density (quantity) of deposits associated with oxygen and nitrogen and forming cores of SSDs, and have envisaged that the SSDs can be decreased either by a method in which the density (quantity) of deposits associated with oxygen and nitrogen is decreased by controlling the three parameters of oxygen concentration, nitrogen concentration, and a cooling concentration in the course of pulling and growing a silicon single crystal 6 before anneal (the first to eleventh aspects of the invention), or by polishing the wafer surface after anneal to a depth of at least 1 μm (the twelfth and thirteenth aspects of the invention).

The methods of decreasing the SSDs include a method to pull a silicon single crystal 6 while varying the cooling rate CR for each of the requirements of the SSD density (or quantity), the solution oxygen concentration, and the nitrogen doping amount.

However, if the cooling rate CR is controlled by varying the same for each of the requirements of the SSD quantity, the solution oxygen concentration, and the nitrogen doping amount, particulars of the control must be changed each time. In order to avoid this, if a requirement of the quantity of SSDs, an approximate range of the solution oxygen concentration and an approximate range of the nitrogen doping amount required as the requirements are preliminarily known, the control may be performed with the cooling rate CR fixed to such a value that these requirements are always satisfied (the fourth to eighth aspects of the invention).

The cooling rate CR can be controlled by using cooling means (such as a cooling jacket 14) (the ninth aspect of the invention). The cooling rate CR of the silicon single crystal 6 can be increased by the use of the cooling means (such as a cooling jacket 14).

An annealed wafer (the tenth and eleventh aspects of the invention) produced by the silicon single crystal producing method of the present invention (the first to ninth aspects of the invention) is a characteristic wafer exhibiting an extremely low SSD density (0.15/cm² or lower) on the surface thereof.

In addition to the reduction of the SSD density, the requirements are satisfied also for the oxygen concentration and the nitrogen concentration. Further, the silicon single crystal 6 can be pulled and grown under growth conditions corresponding to a low V/G region desirable for an annealed wafer (FIG. 1).

According to the present invention, therefore, a high-quality annealed wafer can be reliably produced.

Further, the SSD density (quantity) Nssd on an annealed wafer surface can be equally reliably decreased by producing a silicon single crystal 6 (doped with nitrogen) without performing the control of the first to ninth aspect of the invention in the course of pulling and growing the silicon single crystal 6, and then implementing the an annealed wafer producing method of including a step of annealing a nitrogen doped silicon wafer obtained from the silicon single crystal 6 and a step of polishing the wafer surface, after anneal, to a depth of at least 1 μm from the surface (the thirteenth aspect of the invention). The annealed wafer produced by this annealed wafer producing method (the twelfth aspect of the invention) is a characteristic wafer exhibiting an extremely low SSD density on the surface thereof (0.04/cm² or lower).

BEST MODE FOR CARRYING OUT THE INVENTION

An embodiment of a silicon wafer producing method according to the present invention will be described with reference to the drawings.

FIG. 3 is a diagram showing an example of configuration of a silicon single crystal producing apparatus for use in the embodiment, as viewed from a side.

As shown in FIG. 3, a single crystal pulling apparatus 1 according to the embodiment has a CZ furnace (chamber) 2 serving as a single crystal pulling vessel.

A quartz crucible 3 is arranged within the CZ furnace 2 to accommodate a polycrystalline silicon raw material that is molten as a melt 5. The outside of the quartz crucible 3 is covered with a graphite crucible 11. A heater 9 is provided to the side on the outside of the quartz crucible 3, for heating and melting the polycrystalline silicon raw material within the quartz crucible 3. The heater 9 is controlled in the output (power; kW) to adjust the amount of heat applied to the melt 5. For example, the temperature of the melt 5 is detected, and the output of the heater 9 is controlled by using the detected temperature as a feedback amount so that the temperature of the melt 5 will reach the target temperature.

A heat-insulating cylinder 13 is provided between the heater 9 and the inner walls of the CZ furnace 2.

A pulling mechanism 4 is provided above the quartz crucible 3. The pulling mechanism 4 includes a pulling shaft 4a and a seed chuck 4c at the distal end of the pulling shaft 4a. A seed crystal 14 is held by the seed chuck 4c.

Polycrystalline silicon (Si) is heated and melted inside the quartz crucible 3. Upon the temperature of the melt 5 being stabilized, the pulling mechanism 4 is actuated and a silicon single crystal (silicon single crystal ingot) 6 is pulled up from the melt 5. Specifically, the pulling shaft 4a is lowered so that the seed crystal 14 held by the seed chuck 4c at the distal end of the pulling shaft 4a is immersed in the melt 5. After the seed crystal 14 has been wetted by the melt 5, the pulling shaft 4a is raised. The silicon single crystal 6 (hereafter, referred to as the "silicon single crystal 6") grows as the seed crystal 14 held by the seed chuck 4c is raised. During the pulling, the quartz crucible 3 is rotated by a rotary shaft 10 at a rotation speed ω1. The pulling shaft 4a of the pulling mechanism 4 rotates at a rotation speed ω2 in the same direction as or in the opposite direction to the rotary shaft 110.

According to this embodiment, a silicon wafer having a nitride film, for example, may be preliminarily placed in the melt 5 in the quartz crucible 3 in order to dope the silicon single crystal 6 with nitrogen when pulled.

The rotary shaft 10 can be driven vertically, allowing the quartz crucible 3 to be moved up and down to a desired position.

The inside of the CZ furnace 2 is kept under a vacuum (of about 20 Torr, for example) by isolating the inside of the furnace 2 from the outside atmosphere. Specifically, argon gas 7 is supplied as an inert gas to the CZ furnace 2 and discharged by a pump from an exhaust port of the CZ furnace 2. This keeps the inside of the furnace 2 at a predetermined reduced pressure.

Various evaporated materials are generated within the CZ furnace 2 during the process of pulling a single crystal (one batch). For this reason, the argon gas 7 is supplied to the CZ furnace 2 to purge the evaporated materials to the outside of the CZ furnace 2, thereby cleaning the inside of the CZ furnace 2 of the evaporated materials. The supply flow rate of the argon gas 7 is set for each step in one batch.

The amount of the melt 5 is gradually decreased as the silicon single crystal 6 is pulled. As the amount of the melt 5 is decreased, the contact surface area between the melt 5 and the quartz crucible 3 changes, and the amount of oxygen dissolved from the quartz crucible 3 changes. These changes affect the oxygen concentration distribution in the silicon single crystal 6 being pulled. In order to prevent this, additional polycrystalline silicon raw material or silicon single crystal raw material may be supplied, either during or after the pulling, into the quartz crucible 3 in which the amount of the melt 5 has been decreased.

A heat shield plate 8 (gas rectifying tube) having a substantially inverted circular truncated cone shape is provided to surround the silicon single crystal 6 above the quartz crucible 3. The heat shield plate 8 is supported by the heat insulating cylinder 13. The heat shield plate 8 guides the argon gas 7, which is used as a carrier gas supplied from above into the CZ furnace 2, toward the center of the melt surface 5a, and then guides it across the melt surface 5a to the peripheral edge of the melt surface 5a. The argon gas 7 is discharged from an exhaust port provided at a lower part of the CZ furnace 2 along with gas evaporated from the melt 5. This stabilizes the gas flow rate over the liquid surface, and keeps the oxygen evaporated from the melt 5 in a stable state.

The heat shield plate 8 thermally insulates and shields the seed crystal 14 and silicon single crystal 6 grown from the seed crystal 14, from the radiant heat generated by high-temperature components such as the quartz crucible 3, the melt 5, and the heater 9. The heat shield plate 8 also prevents impurities (such as silicon oxide) generated within the furnace from adhering to the silicon single crystal 6 and hindering the growth of thereof. The size of a gap H between the melt surface 5a and the lower end of the heat shield plate 8 can be adjusted by raising or lowering the rotary shaft 10 and varying the vertical position of the quartz crucible 3. The gap H may also be adjusted by vertically moving the heat shield plate 8 with an elevator apparatus.

The growth condition V/G (V denotes a growth rate, and G denotes an axial temperature gradient of crystal) of the silicon single crystal 6 can be controlled by adjusting the gap H, the rise velocity of the pulling shaft 4a, and so on.

The nitrogen concentration (nitrogen loading; atoms/cm$^3$) in the silicon single crystal 6 is controlled by adjusting the nitrogen input to the quartz crucible 3.

Further, the oxygen concentration (atoms/cm$^3$) in the silicon single crystal 6 is controlled by adjusting the crucible rotation speed ω1, the pulling shaft rotation speed ω2, the argon gas flow rate, the pressure inside the furnace, and so forth during the pulling. A magnet 15 is provided around the CZ furnace 2 to apply a horizontal magnetic field (lateral magnetic field) to the melt 5 in the quartz crucible 3. The application of a horizontal magnetic field to the melt 5 inhibits generation of convection of the melt 5 within the quartz crucible 3, resulting in stabilization of the crystal growth. Further, the oxygen concentration can be controlled favorably by adjusting the crucible rotation speed while applying a horizontal magnetic field to the melt 5.

A cooling jacket 14 for cooling the silicon single crystal 6 being pulled is provided in the inside of the heat shield plate 8, at a position surrounding the silicon single crystal 6 being pulled. The axial temperature gradient of the silicon single crystal 6 is varied by adjusting the cooling capacity of the cooling jacket 14, whereby the cooling rate of the silicon single crystal 6 is controlled. The cooling rate of the silicon single crystal 6 can be controlled by adjusting the flow rate of coolant passing through the inside of the cooling jacket 14, for example. Any desired cooling means may be used for cooling the silicon single crystal 6. For example, an additional heat shield plate may be provided, separately from the heat shield plate 8, around the silicon single crystal 8 to control the cooling rate of the silicon single crystal 6.

An ingot of the silicon single crystal 6 produced by the apparatus shown in FIG. 3 is cut with a cutter to obtain silicon wafer. The silicon wafer is annealed as shown in FIG. 2 after being subjected to processes including chamfering, lapping, etching, polishing, and cleaning before thermal treatment.

The silicon wafer is annealed according to a recipe shown in FIG. 4. Specifically, the temperature is ramped (increased) up to a maximum temperature at a predetermined temperature-increase rate T° C./min, and is kept at a temperature in a range from about 1150° C. to about 1250° C. (for example 1200° C.) for t hours (for one or more hours, for one or two hours, for example), so that the silicon wafer is annealed. Subsequently, the temperature is ramped down (decreased) at a predetermined temperature-decrease rate T° C./min, and the silicon wafer is unloaded from the annealing furnace. The annealing is carried out in an argon gas atmosphere, for example. The annealing may be also carried out in an atmosphere such as hydrogen gas atmosphere, or an atmosphere of gas mixture of hydrogen and argon gas.

Description will be made of the findings of the present invention.

The present inventors carried out experiments and simulation to obtain the following findings about SSDs:

a) Specific and quantitative values of oxygen concentration and nitrogen concentration required to decrease the quantity of SSDs;

b) Specific parameters other than oxygen concentration and nitrogen concentration causing generation of SSDs; and c) Degree of dependency and relationship between the parameters causing generation of SSDs.

In the first place, silicon single crystals were pulled while varying the crystal growth conditions, oxygen concentration, and nitrogen concentration, and silicon wafers were obtained by cutting out from the respective silicon ingots and annealed. A quantity of SSDs on the surface of each of the annealed wafers (samples) was measured.

The term "SSD" as used herein means a defect of a wafer surface that is detected in the DNN (dark-field normal narrow) mode by using a commercially available Particle Counter SP1. The DNN mode is a mode in which laser light is applied vertically to the wafer and then collected in a portion close to regular reflection to observe the diffuse reflection due to the defects. The DNN mode is particularly effective to detect foreign particles and pits (depressions) on the wafer surface.

FIGS. 5A through 5J show SSD distributions and quantities of SSDs on the annealed wafer surfaces. FIGS. 5A to 5E (the diagrams in the upper row) show annealed wafers annealed in a hydrogen gas atmosphere, while FIGS. 5F to 5J (the diagrams in the lower row) show annealed wafers annealed in an argon gas atmosphere. The quantities of SSDs are shown respectively for those with a diameter of 0.12 µm or greater and those with a diameter of 0.14 µm or greater.

FIGS. 5A and 5F show samples of a comparative example which is an annealed wafer obtained from a silicon single crystal with a diameter of 200 mm. The other samples than those shown in FIGS. 5A and 5F are of an annealed wafer obtained from a silicon single crystal with a diameter of 300 mm. In order to compare the quantities of SSDs with respect to samples having a same diameter, the samples having a diameter 300 mm were processed to reduce the diameter to 200 mm before annealing.

The samples of the comparative example shown in FIGS. 5A and 5F are annealed wafers obtained from a silicon single crystal pulled in a V-rich region which is on the higher-rate side than the low V/G region shown in FIG. 1. In contrast, the samples other than those of the comparative example shown in FIGS. 5A and 5F are annealed wafers obtained from a silicon single crystal pulled in the low V/G region shown in FIG. 1.

It is seen from FIGS. 5A through 5J that the quantity of SSDs is obviously greater when the silicon single crystal is pulled under crystal growth conditions corresponding to the low V/G region than when the silicon single crystal is pulled under crystal growth conditions corresponding to the V-rich region present on the higher-rate side than the low V/G region.

The results were obtained that the hydrogen gas atmosphere contributed to the reduction of SSDs slightly more than the argon gas atmosphere.

FIG. 6A is a graph in which oxygen concentration is plotted on the horizontal axis while the quantity of SSDs is on the vertical axis. Silicon single crystals were pulled while varying the oxygen concentration, the nitrogen concentration, and the crystal pulling rate, and the quantity of SSDs was measured for each annealed wafer. The SSDs having a diameter of 0.14 µm or more were counted. FIG. 6B is a table showing the cooling rate, the oxygen concentration, and the nitrogen concentration for each of the groups A, B, C, and D of FIG. 6B.

The group indicated by A in FIGS. 6A and 6B represents measurement results of annealed wafers obtained from a silicon single crystal that is doped with nitrogen, and pulled under the crystal growth conditions corresponding to the low V/G region and in which the cooling rate is low. For this group A, the cooling rate (° C./min) is from 0.27 to 0.33, the oxygen concentration (×E17 atoms/cc) is from 11.2 to 13.4, and the nitrogen concentration (×E14 atoms/cc) is 0.7 to 1.2.

The group indicated by B in FIGS. 6A and 6B represents measurement results of annealed wafers obtained from a silicon single crystal that is doped with nitrogen, and pulled under crystal growth conditions corresponding to the V-rich region and in which the cooling rate is medium. For this group A, the cooling rate (° C./min) is from 0.40 to 0.44, the oxygen concentration (×E17 atoms/cc) is from 11.4 to 12.5, and the nitrogen concentration (×E14 atoms/cc) is from 0.6 to 0.7.

The group indicated by C in FIGS. 6A and 6B represents measurement results of annealed wafers obtained from a silicon single crystal that is doped with nitrogen, and pulled under crystal growth conditions corresponding to the V-rich region and in which the cooling rate is high. For this group C, the cooling rate (° C./min) is from 0.73 to 0.77, the oxygen concentration (×E17 atoms/cc) is from 9.3 to 11.4, and the nitrogen concentration (×E14 atoms/cc) is from 1.1 to 1.3.

The group indicated by D in FIGS. 6A and 6B represents measurement results of annealed wafers obtained from a silicon single crystal that is not doped with nitrogen, and is pulled under crystal growth conditions corresponding to the V-rich region and in which the cooling rate is medium. For this group D, the cooling rate (° C./min) is from 0.38 to 0.42, and the oxygen concentration (×E17 atoms/cc) is from 14.0 to 15.0.

It is seen from FIGS. 6A and 6B that the quantity of SSDs tends to be greater as the oxygen concentration becomes higher.

Comparing the groups B and D whose cooling rates are both medium, the quantity of SSDs is greater in the group B involving the nitrogen doping than in the group D not involving nitrogen doping. It can be known from this that the quantity of SSDs tends to be greater as the nitrogen concentration becomes higher.

Comparing the groups A, B and C involving nitrogen doping, the quantity of SSDs is greater in the group B the cooling rate of which is medium than the group C the cooling rate of which is high. The quantity of SSDs is greater in the group A the cooling rate of which is low than in the group B the cooling rate of which is medium. It can be seen from this that the quantity of SSDs tends to be greater as the cooling rate becomes lower.

The bottom side of a silicon single crystal having a straight cylindrical shape, where a tail portion is to be formed, is cooled at a higher cooling rate than the other portions of the silicon single crystal. Therefore, relationship between the cooling rate and the SSD was further examined.

FIG. 7 is a graph in which the position of the silicon single crystal 6 is plotted on the horizontal axis, while the oxygen concentration Oi is plotted on the left-side vertical axis and the quantity of SSDs on the right-side vertical axis. An ingot of the silicon single crystal 6 is schematically shown along the horizontal axis of FIG. 7. The left end of the horizontal axis of FIG. 7 corresponds to the top end of the straight cylindrical ingot of the silicon single crystal 6, while the right end of the horizontal axis corresponds to the bottom end of the straight cylindrical ingot of the silicon single crystal 6. SSDs having a diameter of 0.14 µm or greater were counted.

In FIG. 7, the plots indicated by a circle mark (○) represent the oxygen concentration, while the plots indicated by cross mark (×) represent the quantity of SSDs.

It can be seen from FIG. 7 that the quantity of SSDs (×) increases along with the increase of oxygen concentration (○), and there is correlation between the oxygen concentration (○) and the quantity of SSDs (×). However, the cooling rate is once decreased and then increased when forming the tail portion of a silicon single crystal. Thus, a portion E of the silicon single crystal where the cooling rate is decreased and a portion F where the cooling rate is increased have different cooling rates from the other portion having a straight cylindrical shape. Therefore, a tendency was observed that the oxygen concentration (○) was not correlated with the quantity of SSDs (×).

It can be seen from observation of the "portion where the cooling rate is low" E and the "portion where the cooling rate is high" F in FIG. 7 that the quantity of SSDs tends to be decreased as the cooling rate is increased.

Based on the foregoing, the present inventors estimated that a SSD density Nssd on an annealed wafer surface would be able to be computed by using, as parameters, the oxygen concentration Oi (atoms/cm$^3$), the nitrogen concentration N (atoms/cm$^3$), and the cooling rate CR (° C./min) in a predetermined temperature range.

Therefore, an equation to estimate the SSD density Nssd (hereafter, referred to as the "SSD density estimating equation") was obtained as follows by multiple regression analysis based on the experiment results.

$$Nssd=A[Oi]^l[N]^m[CR]^n \text{(where } l>0, m>0, \text{ and } n<0) \quad (1)$$

The values of A, l, m, and n are constants which vary depending on a threshold value for a defect diameter to be determined as SSD, an annealed wafer diameter, and a temperature range of the cooling rate.

These values were as specified below, when the diameter of the annealed wafer was 300 mm, the temperature range of cooling rate was 950° C., and defects having a diameter of 0.14 µm or greater were to be determined as SSDs.

A=exp(−420.0)
l=9.0
m=1.3
n=−1.7

FIG. 8 shows correlation between actual SSD values and estimated SSD values, in which the actual values of the SSD quantity, which were obtained by measuring the surface of an annealed wafer with a diameter of 300 mm in the DNN mode with the use of the above-mentioned instrument SP1, are plotted on the horizontal axis, while the estimated values of the SSD quantity, which were obtained by converting the SSD density of an annealed wafer with a diameter of 300 mm obtained by the SSD density estimating equation (Equation (1)) into a quantity of SSDs on the surface of an annealed wafer with a diameter of 300 mm, are plotted on the vertical axis. Pt1 denotes individual congruent points, and L1 is a correspondence line obtained from the congruent points Pt1. As seen from FIG. 8, the estimated values of the SSD quantity substantially matched with the actual values.

FIG. 9 shows correspondence lines L21, L22, L23, and L24 obtained from the SSD density estimating equation (Equation (1)). In FIG. 9, the horizontal axis represents the oxygen concentration Oi (×E17 atoms/cm$^3$), and the vertical axis represents the cooling rate (° C./min) at a temperature of 900° C. to 1000° C. (e.g. 950° C.). The correspondence lines L21, L22, L23, and L24 respectively represent correlation between the oxygen concentration Oi (×E17 atoms/cm$^3$) when the nitrogen concentration N (atoms/cm$^3$) are 5E13, 1E14, 2.5E14, and 5E14, respectively, and the cooling rate CR required to decrease the SSD density on the surface of an annealed wafer with a diameter of 300 mm to 0.15/cm$^2$ or lower (to decrease the quantity of defects on the surface of an annealed wafer with a diameter of 300 mm to 100 or less). The SSD density in FIG. 9 denotes a density of SSDs with a diameter of 0.14 µm or greater.

Accordingly, it is possible to obtain a cooling rate CR required to decrease the SSD density to 0.15/cm$^2$ or lower by using the oxygen concentration Oi and the nitrogen concentration N as parameters on the basis of the correspondence lines L21, L22, L23, and L24 shown in FIG. 9.

A silicon single crystal is often pulled under crystal growth conditions in which the nitrogen concentration N is set to about 2.5E14 (atoms/cm$^3$) or lower, and the oxygen concentration Oi is set to about 14 (×E17 atoms/cm$^3$) or lower. As seen from FIG. 9, the cooling rate CR is 2.5 (° C./min) when the nitrogen concentration N is 2.5E14 (atoms/cm$^3$) and the oxygen concentration Oi is 14 (×E17 atoms/cm$^3$). Accordingly, the SSD density on the surface of an annealed wafer with a diameter of 300 mm can be reliably decreased to 0.15/cm$^2$ or lower (corresponding to 100 defects on the surface of an annealed wafer with a diameter of 300 mm) when the silicon single crystal is pulled while controlling the cooling rate CR at a temperature of 900° C. to 1000° C. (e.g. 950° C.) at 2.5 (° C./min) or higher, as long as the nitrogen concentration N is adjusted to about 2.5E14 (atoms/cm$^3$) or lower and the oxygen concentration Oi is adjusted to about 14 (×E17 atoms/cm$^3$) or lower.

Likewise, FIG. 10 shows correspondence lines L31, L32, L33, and L34 obtained from the SSD density estimating equation (Equation (1)). In FIG. 10, the horizontal axis represents the oxygen concentration Oi (×E17 atoms/cm$^3$), and the vertical axis represents the cooling rate (° C./min) at a temperature of 900° C. to 1000° C. (e.g. 950° C.). The correspondence lines L31, L32, L33, and L34 respectively represent correlation between oxygen concentration Oi (×E17 atoms/cm$^3$) and the cooling rate CR required to decrease the SSD density on the surface of an annealed wafer with a diameter of 300 mm to 0.3/cm$^2$ or lower (to decrease the quantity of defects on the surface of an annealed wafer with a diameter of 300 mm to 200 or less) when the nitrogen concentration N (atoms/cm$^3$) are 5E13, 1E14, 2.5E14, and 5E14, respectively. The SSD density in FIG. 10 denotes a density of SSDs with a diameter of 0.14 µm or greater.

Accordingly, it is possible to obtain a cooling rate CR required to decrease the SSD density to 0.3/cm$^2$ or lower by using the oxygen concentration Oi and the nitrogen concentration N as parameters on the basis of the correspondence lines L31, L32, L33, and L34 shown in FIG. 10.

Similarly to what is described with reference to FIG. 9, it can be seen from the correspondence lines L31, L32, L33, and L34 in FIG. 10 that the SSD density on the surface of an annealed wafer with a diameter of 300 mm can be reliably decreased to 0.3/cm$^2$ or lower (corresponding to 200 or less defects on the surface of an annealed wafer with a diameter of 300 mm) when the silicon single crystal is pulled while controlling the cooling rate CR at a temperature of 900° C. to 1000° C. (e.g. 950° C.) at 1.5 (° C./min) or higher, as long as the nitrogen concentration N is adjusted to about 2.5E14 (atoms/cm$^3$) or lower and the oxygen concentration Oi is adjusted to about 14 (×E17 atoms/cm$^3$) or lower.

FIG. 11 shows equal cooling rate line L41, . . . obtained from the SSD density estimating equation (Equation (1)). In FIG. 11, the horizontal axis represents the oxygen concentration Oi (×10$^{17}$ atoms/cm$^3$), while the vertical axis represents the nitrogen concentration N (×10$^{14}$ atoms/cm$^3$). A maximum value in the range of the oxygen concentration Oi plotted on the horizontal axis is 14 (×10$^{17}$ atoms/cm$^3$). A maximum value in the range of the nitrogen concentration N plotted on the vertical axis is 5 (×10$^{14}$ atoms/cm$^3$). Each of the equal cooling rate lines L41, . . . indicates a cooling rate CR (° C./min) required to decrease the SSD density on the surface of an annealed wafer with a diameter of 300 mm to 0.15/cm$^2$ or lower (corresponding to 100 or less defects on the surface of an annealed wafer with a diameter of 300 mm), at an arbitrary oxygen concentration Oi (×10$^{17}$ atoms/cm$^3$) and an arbitrary nitrogen concentration N (×10$^{14}$ atoms/cm$^3$).

Accordingly, it is possible to obtain a cooling rate CR required to decrease the SSD density to 0.15/cm$^2$ or lower by using the oxygen concentration Oi and the nitrogen concentration N as parameters on the basis of the equal cooling rate lines L41, . . . shown in FIG. 11.

A silicon single crystal is typically pulled under crystal growth conditions in which the nitrogen concentration N is set to 5 (×10$^{14}$ atoms/cm$^3$; the maximum value in the range of the nitrogen concentration N on the vertical axis) or lower, while the oxygen concentration Oi is set to 14 (×10$^{17}$ atoms/cm$^3$; the maximum value in the range of the oxygen concentration Oi on the horizontal axis) or lower. It can be seen from FIG. 11 that the equal cooling rate line (the cooling rate corresponding to the maximum value on the horizontal axis and the maximum value on the vertical axis) is 4.2 (° C./min), when the nitrogen concentration N is 5 (×10$^{14}$ atoms/cm$^3$; the maximum value in the range of the nitrogen concentration N on the vertical axis) and the oxygen concentration Oi is 14 (×10$^{17}$ atoms/cm$^3$; the maximum value in the range of the oxygen concentration Oi on the horizontal axis). Accordingly, it is possible to reliably decrease the SSD density on the surface of an annealed wafer with a diameter of 300 mm to 0.15/cm$^2$ or lower (corresponding to 100 or less defects on the surface of an annealed wafer with a diameter of 300 mm) when the silicon single crystal is pulled while controlling the cooling rate CR at a temperature of 900° C. to 1000° C. (e.g. 950° C.) at 4.2 (° C./min) or higher, as long as the nitrogen concentration and oxygen concentration are adjusted in a normal range, that is, the nitrogen concentration N is adjusted in a range of 5 (×10$^{14}$ atoms/cm$^3$; the maximum value in the range of the nitrogen concentration N on the vertical axis) or lower and the oxygen concentration Oi is adjusted in a range of 14 (×10$^{17}$ atoms/cm$^3$; the maximum value in the range of the oxygen concentration Oi on the horizontal axis) or lower.

FIG. 12 shows equal cooling rate lines L51, . . . obtained from the SSD density estimating equation (Equation (1)). In FIG. 12, the horizontal axis represents the oxygen concentration Oi (×10$^{17}$ atoms/cm$^3$), while the vertical axis represents the nitrogen concentration N (×10$^{14}$ atoms/cm$^3$). A maximum value in the range of the oxygen concentration Oi on the horizontal axis is 14 (×10$^{17}$ atoms/cm$^3$). A maximum value in the range of the nitrogen concentration N on the vertical axis is 5 (×10$^{14}$ atoms/cm$^3$). Each of the equal cooling rate lines L51, . . . indicates a cooling rate CR (° C./min) required to decrease the SSD density on the surface of an annealed wafer with a diameter of 300 mm to 0.3/cm$^2$ or lower (corresponding to 200 or less defects on the surface of an annealed wafer with a diameter of 300 mm), at an arbitrary oxygen concentration Oi (×10$^{17}$ atoms/cm$^3$) and an arbitrary nitrogen concentration N (×10$^{14}$ atoms/cm$^3$).

Accordingly, it is possible to obtain a cooling rate CR required to decrease the SSD density to 0.3/cm$^2$ or lower by using the oxygen concentration Oi and the nitrogen concentration N as parameters on the basis of the equal cooling rate lines L51, . . . shown in FIG. 12.

Therefore, similarly to what is described with reference to FIG. 11, it can be seen from the equal cooling rate lines L51, . . . shown in FIG. 12 that the SSD density on the surface of an annealed wafer with a diameter of 300 mm can be reliably decreased to 0.3/cm$^2$ or lower (corresponding to 200 or less defects on the surface of an annealed wafer with a diameter of 300 mm) when the silicon single crystal is pulled while controlling the cooling rate CR at a temperature of 900° C. to 1000° C. (e.g. 950° C.) at 2.8 (° C./min) or higher, as long as the nitrogen concentration and the oxygen concentration are adjusted in a normal range, that is, the nitrogen concentration N is adjusted in a range of 5 (×10$^{14}$ atoms/cm$^3$; the maximum value in the range of the nitrogen concentration N on the vertical axis) or lower and the oxygen concentration Oi is adjusted to in a range of 14 (×10$^{17}$ atoms/cm$^3$; the maximum value in the range of the oxygen concentration Oi on the horizontal axis) or lower.

The findings about mechanism of generation of SSDs, and shapes and sizes of SSDs will be described.

The following findings were obtained on the basis of the results of experiments and simulations as described above:

a) Specific and quantitative values of oxygen concentration and nitrogen concentration required to decrease the SSD density (or quantity of SSDs) (Equation (1), FIGS. 9 to 12);

b) Other specific parameters than oxygen concentration and nitrogen concentration causing generation of SSDs (a cooling rate CR in a predetermined temperature range); and c) Degree of dependency and relationship between parameters causing generation of SSDs (Equation (1), FIGS. 9 to 12).

On the basis of these findings a), b), and c), it is believed that the SSDs are defects grown by a mechanism in which when a silicon single crystal is pulled, deposits are produced in association with oxygen and nitrogen within the silicon single crystal, and these deposits associated with oxygen and nitrogen are caused by being annealed to serve as cores to grow the defects on the wafer surface layer into a form of defects easy to detect in the DNN mode with the use of a Particle Counter SP1.

As described above, therefore, it is believed that, when a silicon single crystal is pulled while controlling the parameters of the oxygen concentration, the nitrogen concentration, and the cooling rate, the deposits associated with oxygen and nitrogen and serving as cores of the SSDs can be vanished or reduced in size before performing an annealing process, and thus the deposits can be prevented from being exposed as SSDs after the annealing process.

Therefore, further measurements were conducted to study characteristics of the SSDs by using a MAGICS (wafer defect inspection/review system M350H from Laser Tec), and an AFM (SPA-460 from SEIKO Instruments Inc.).

FIGS. 13A and 13B show results of measurement of an annealed wafer surface using MAGICS. It can be seen from FIGS. 13A and 13B that SSDs are defects recessed into the wafer surface.

FIGS. 13C and 13D show results of measurement of an annealed wafer surface using AFM. It can be seen also from FIGS. 13C and 13D that SSDs are defects recessed into the wafer surface. It also can be seen that the SSDs are very gentle recesses having a width of 0.5 to 2.5 μm and a depth of about 2 to 5 nm. In other words, the SSDs are recessed defects having a very shallow and wide shape.

The measurements were conducted while changing the annealing atmosphere. It was found, as a result, that the SSDs were exposed regardless of the type of atmosphere, argon gas, hydrogen gas, or gas mixture thereof. Thus, the annealing atmosphere did not have any particular influence (as described above, however, the SSDs were slightly decreased in hydrogen gas atmosphere than in argon gas atmosphere).

In view of the SSDs being very shallow recessed defects, it was envisaged that the SSDs would be vanished by polishing, and the surface of an annealed wafer was polished and measured in the DNN mode with SP1.

FIG. 14 shows, in comparison, the result of measurement of the surface of a wafer directly after annealing (in FIG. 14, indicated as "after anneal") in the DNN mode with SP1, and the result of measurement of the surface of an wafer that has been polished to a depth of 1 μm from the wafer surface after annealing (in FIG. 14, indicated as "after polish") in the DNN mode with SP1. The measurement was conducted both "after anneal" and "after polish" on each of the annealed wafers forming a group D, the annealed wafers forming a group B and the annealed wafers forming a group A, and measurement results were compared. Among the SSDs detected on the surface of an annealed wafer with a diameter of 300 mm, only those having a diameter of 0.14 μm were counted.

As seen from FIG. 14, as for the annealed wafers forming the group A, while a large quantity of (999) SSDs were present on the wafer surface directly after annealing, the quantity thereof was dramatically decreased (to two SSDs) by polishing the wafer surface for 1 μm only.

Further experiments were conducted on various types and a large number of samples having different oxygen concentrations, nitrogen concentrations, and cooling rates in order to study the SSD decreasing effect obtained by polishing.

FIG. 15 shows, in comparison, the result of measurement of the surface of a wafer directly after annealing (in FIG. 15, indicated as "after anneal") for each of the samples #1 to #10 in the DNN mode with the use of SP1 and the result of measurement of the surface of a wafer polished to the depth of 1 μm from the wafer surface after annealing (in FIG. 15, indicated as "after polish") for the samples #1 to #10, in the DNN mode with the use of SP1.

As seen from FIG. 15, while a large quantity of SSDs were present on the wafer surface directly after annealing (at least 250 defects in the samples #1 to #10), the quantity thereof was dramatically decreased (to at maximum 26 defects in the samples #1 to #10) by polishing the wafer surface by 1 μm only. It is thus believed that the quantity of SSDs can be decreased to about 30 (corresponding to 0.04/cm$^2$ in surface density) or less by polishing the surface of an annealed wafer by 1 μm.

In view of the foregoings, it is believed that the SSDs are locally present in the very superficial portion of an annealed wafer and thus can be substantially vanished by polishing of the very superficial portion, namely to a depth of at least about 1 μm from the surface thereof.

Further, experiments of oxide film dielectric breakdown characteristic were conducted on annealed wafers including a large quantity of SSDs. The experiments revealed that approximately 100% of the wafers were nondefective regardless of the test method, either the TZDB test or the TDDB test.

Thus, the present inventors have obtained findings as follows.

d) There are generated, in a nitrogen-doped annealed wafer, very shallow and wide defects recessed into the wafer surface (SSDs).

e) The SSDs have no adverse effects on the oxide film dielectric breakdown characteristics.

f) The SSDs are exposed after anneal regardless of annealing atmosphere.

g) The SSDs are locally present in a very superficial portion of the annealed wafer surface and thus can be substantially vanished by polishing the wafer surface by at least 1 μm.

In view of the findings a) to g) above, preferred examples for commercially producing high-quality annealed wafers will be described.

Example 1

In a production method of Example 1, the silicon single crystal 6 is pulled from the melt 5 with the use of the single crystal pulling apparatus 1 shown in FIG. 3, while decreasing the density or quantity of deposits associated with oxygen and nitrogen and forming cores of SSDs by controlling the three parameters of oxygen concentration Oi, nitrogen concentration N, and cooling rate CR in a predetermined temperature range.

The control of the three parameters of oxygen concentration Oi, nitrogen concentration N, and cooling rate CR in a predetermined temperature range is performed by using the above-mentioned Equation (1), $Nssd=A[Oi]^l[N]^m[CR]^n$ (where l>0, m>0, and n<0).

The nitrogen concentration N (nitrogen loading; atoms/cm$^3$) within the silicon single crystal 6 is controlled by adjusting the nitrogen input into the quartz crucible 3.

The oxygen concentration Oi (atoms/cm$^3$) within the silicon single crystal 6 is controlled by adjusting the crucible rotation speed ω1, the pulling shaft rotation speed ω2, the argon gas flow rate, the internal pressure within the furnace and so on during the pulling of the crystal. Further, the oxygen concentration Oi is controlled by adjusting the crucible rotation speed while applying a horizontal magnetic field to the melt 5 with the use of the magnet 15.

The cooling rate of the silicon single crystal 6 is controlled by adjusting the cooling capacity of the cooling jacket 14. The cooling rate of the silicon single crystal 6 may be controlled by using other cooling means than the cooling jacket 14 as described above.

The growth condition V/G (V denotes a growth rate, and G denotes an axial temperature gradient in the crystal) of the silicon single crystal 6 is controlled by adjusting the gap H, the lifting speed of the pulling shaft 4a, and so on. For example, the growth condition V/G is controlled so as to be included in the low V/G region shown in FIG. 1.

Then, the pulled silicon single crystal 6 is annealed to provide an annealed wafer.

In this manner, the SSD density Nssd on the annealed wafer surface can be decreased by appropriately adjusting the oxygen concentration, the nitrogen concentration, and the cooling rate. Although a large quantity of SSDs are generated when a silicon single crystal is pulled under the conditions corresponding to the low V/G region according to prior arts, the quantity of SSDs can be dramatically decreased according to Example 1, even if the silicon single crystal 6 is pulled under the conditions corresponding to the low V/G region.

Example 2

According to a production method of Example 2, a SSD density Nssd detected on a wafer surface is estimated by using a relational expression established among SSD density Nssd, oxygen concentration Oi in the silicon single crystal 6, nitrogen concentration in the silicon single crystal 6, and a cooling rate CR in a predetermined temperature range during pulling of the silicon single crystal 6. The SSD density Nssd is estimated by using the above-mentioned Equation (1), Nssd=A [Oi]$^l$[N]$^m$[CR]$^n$ (where, l>0, m>0, and n<0).

The silicon single crystal 6 is then pulled from the melt 5 under crystal growth conditions in which the oxygen concentration Oi, the nitrogen concentration N, and the cooling rate CR in a predetermined temperature range are such that the estimated SSD density Nssd is obtained.

Since there are four variables in the Equation (1), once three of the parameters are determined, the remaining one parameter is determined. For example, when the value of the SSD density, the oxygen deposit density defining the gettering capacity, and the values of oxygen concentration Oi and nitrogen concentration N as requirements required for satisfying the quality such as thickness of defect-free layer of a wafer surface are given, the remaining cooling rate CR can be found.

The cooling capacity of the cooling jacket 14 may be adjusted such that the cooling rate CR thus found is obtained. Specific control means for the oxygen concentration Oi and the nitrogen concentration N are the same as those in Example 1.

The pulled silicon single crystal 6 is then annealed to provide an annealed wafer. As a result, the SSD density Nssd on the annealed wafer surface can be decreased to a desired value.

FIG. 16 is a table showing, for each test, the cooling rate, the oxygen concentration, the nitrogen concentration, the actual SSD density, and the estimated SSD density as obtained when a silicon single crystal 6 was pulled while varying the desired value of the SSD density Nssd. The counted SSDs were these having a diameter of 140 nm or greater.

As shown in FIG. 16, in the respective tests No. 1, No. 2, No. 3, and No. 4, a silicon single crystal 6 was pulled by using the Equation (1) to obtain the cooling rate CR at 950° C. (0.29, 0.42, 0.75, 0.35° C./min), the oxygen concentration Oi (12.40, 11.70, 11.41, 11.64×E17 atoms/cm$^3$), and the nitrogen concentration N (9.9, 5.0, 10.80, 6.8×E13 atoms/cm$^3$) so that the SSD estimated density Nssd becomes respective desired values of 0.15 (per cm$^2$) or lower (0.54, 0.07, 0.06, 0.14).

The table shows the values of actual SSD density (0.40, 0.10, 0.06, 0.10) which were obtained by measuring the surface of an annealed wafer produced from the silicon single crystal 6 pulled in the tests No. 1, No. 2, No. 3, and No. 4, in the DNN mode with the use of the SP1.

Tests No. 5, No. 6, No. 7, and No. 8 were conducted as comparative examples to compare with this Example 2, wherein a silicon single crystal 6 was pulled by obtaining the cooling rate CR at 950° C. (0.32, 0.37, 0.72, 0.27° C./min), the oxygen concentration Oi (13.77, 12.13, 13.84, 13.63×E17 atoms/cm$^3$), and the nitrogen concentration N (12.6, 6.2, 32.3, 13.3×E13 atoms/cm$^3$) so that the estimated SSD density Nssd is respective desired values exceeding 0.15 (per cm$^2$) (1.62, 0.16, 1.45, 2.12).

The table shows respective values of actual SSD density (1.94, 0.16, 1.59, 2.48) obtained by measuring the surface of an annealed wafer produced from the silicon single crystal 6 pulled in the tests No. 5, No. 6, No. 7, and No. 8, in the DNN mode with the use of SP1.

FIG. 17 shows correlation between the estimated SSD density values of the tests No. 1 to No. 8 and the actual SSD density values of tests No. 1 to No. 8 with the estimated SSD density being plotted on the horizontal axis and the actual SSD density plotted on the vertical axis. Pt2 denotes individual congruent points, and L6 is a correspondence line obtained from the congruent points Pt2. As seen from FIG. 17, the estimated SSD density values substantially match the actual SSD density values. Thus, the SSDs on the annealed wafer surface could be decreased accurately to a substantially desired value when the silicon single crystal 6 was pulled after estimating the SSD density.

Example 3

In FIG. 16, a silicon single crystal 6 was pulled while changing the cooling rate CR for each of the requirements of the quantity of SSDs, the solution oxygen concentration, and the nitrogen doping amount.

However, when control is performed while changing the cooling rate CR for each of the requirements of the quantity of SSDs, the solution oxygen concentration, and the nitrogen doping amount, the particulars of the control must be changed each time. In order to avoid this, if a requirement of the quantity of SSDs, an approximate range of the solution oxygen concentration and an approximate range of the nitrogen doping amount required as the requirements are preliminarily known, the control may be performed with the cooling rate CR fixed to such a value that these requirements are always satisfied.

As mentioned in the above, a cooling rate CR required to decrease the density of SSDs with a diameter of 140 nm or greater to 0.15/cm$^2$ or lower can be obtained by using the oxygen concentration Oi and the nitrogen concentration N as parameters on the basis of the correspondence lines L21, L22, L23, and L24 shown in FIG. 9 or the equal cooling rate lines L41, . . . shown in FIG. 11.

A silicon single crystal 6 is often pulled under crystal growth conditions in which the nitrogen doping amount N is about 2.5E14 (atoms/cm$^3$) or lower (the lower limit is 1E13 atoms/cm$^3$), and the solution oxygen concentration Oi is about 14 (×E17 atoms/cm$^3$) or lower (the lower limit is 11×E17 atoms/cm$^3$). As seen from FIGS. 9 and 11, the cooling rate CR is 2.5 (° C./min) when the nitrogen concentration N is 2.5E14 (atoms/cm$^3$) and the oxygen concentration Oi is 14 (×E17 atoms/cm$^3$).

Accordingly, in this Example, a silicon single crystal 6 is pulled while controlling the cooling rate CR at a temperature of 900° C. to 1000° C. (e.g. 950° C.) at a value of 2.5 (° C./min) or higher (e.g. 2.5° C./min). The control of the cooling rate CR is performed by adjusting the cooling capacity of the cooling jacket 14.

On the other hand, the nitrogen doping amount N and the solution oxygen concentration Oi are controlled to be values according to the respective requirements.

This makes it possible to reliably decrease the SSD density on the surface of an annealed wafer with a diameter of 300 mm to 0.15/cm$^2$ or lower (corresponding to 100 or less defects on the surface of an annealed wafer with a diameter of 300 mm), as long as the nitrogen doping amount N is adjusted to a range of about 2.5E14 (atoms/cm$^3$) or less, specifically in the range of 1E13 to 2.5E14 atoms/cm$^3$ and adjusting the solution oxygen concentration Oi to a range of about 14 (×E17 atoms/cm³) or less, specifically in the range of 11×E17 to 14×E17 atoms/cm³.

According to this Example 3, the cooling rate CR can be fixed to a same value. Therefore, particulars of the control of the cooling rate CR need not be changed for each of the requirements of the quantity of SSDs, the solution oxygen concentration, and the nitrogen doping amount.

Example 4

Similarly to Example 3 described above, a cooling rate CR required to decrease the density of SSDs with a diameter of 140 nm or greater to 0.3/cm² or lower can be obtained by using the oxygen concentration Oi and the nitrogen concentration N as parameters on the basis of the correspondence lines L31, L32, L33, L34 shown in FIG. 10 or the equal cooling rate lines L42, . . . shown in FIG. 12.

A silicon single crystal 6 is often pulled under crystal growth conditions in which the nitrogen doping amount N is about 2.5E14 (atoms/cm³) or less (the lower limit is 1E13 atoms/cm³), and the solution oxygen concentration Oi is about 14 (×E17 atoms/cm³) or less (the lower limit is 11×E17 atoms/cm³). As seen from FIGS. 10 and 12, the cooling rate CR is 1.5 (° C./min) when the nitrogen concentration N is 2.5E14 (atoms/cm³) and the oxygen concentration Oi is 14 (×E17 atoms/cm³).

Accordingly, in this Example, a silicon single crystal 6 is pulled while controlling the cooling rate CR at a temperature of 900° C. to 1000° C. (e.g. 950° C.) at a value of 1.5 (° C./min) or higher (e.g. 2.5° C./min). The control of the cooling rate CR is performed by adjusting the cooling capacity of the cooling jacket 14.

On the other hand, the nitrogen doping amount N and the solution oxygen concentration Oi are controlled to be values according to the respective requirements.

This makes it possible to reliably decrease the SSD density on the surface of an annealed wafer with a diameter of 300 mm to 0.3/cm² or lower (corresponding to 200 or less defects on the surface of an annealed wafer with a diameter of 300 mm) as long as the nitrogen doping amount N is adjusted to a range of about 2.5E14 (atoms/cm³) or less, specifically in the range of 1E13 to 2.5E14 atoms/cm³ and adjusting the solution oxygen concentration Oi to a range of about 14 (×E17 atoms/cm³) or less, specifically in the range of 11×E17 to 14×E17 atoms/cm³.

According to this Example 4, the cooling rate CR can be fixed to a same value. Therefore, particulars of the control of the cooling rate CR need not be changed for each of the requirements of the quantity of SSDs, the solution oxygen concentration, and the nitrogen doping amount.

Example 5

Similarly to Example 3 described above, a cooling rate CR required to decrease the density of SSDs with a diameter of 140 nm or greater to 0.15/cm² or lower can be obtained by using the oxygen concentration Oi and the nitrogen concentration N as parameters on the basis of the equal cooling rate line L41, . . . shown FIG. 11.

A silicon single crystal 6 is normally pulled under crystal growth conditions in which the nitrogen doping amount N is 5 (×10¹⁴ atoms/cm³; the maximum value in the range of the nitrogen concentration N on the vertical axis) or lower, and the oxygen concentration Oi is 14 (×10¹⁷ atoms/cm³; the maximum value in the range of the oxygen concentration Oi on the horizontal axis) or lower. As seen from FIG. 11, the equal cooling rate line (the cooling rate corresponding to the maximum value on the horizontal axis and the maximum value on the vertical axis) is 4.2 (° C./min) when the nitrogen concentration N is 5 (×10¹⁴ atoms/cm³; the maximum value in the range of the nitrogen concentration N on the vertical axis) and the oxygen concentration Oi is 14 (×10¹⁷ atoms/cm³; the maximum value in the range of the oxygen concentration Oi on the horizontal axis).

Accordingly, in this Example 5, a silicon single crystal 6 is pulled while controlling the cooling rate CR at a temperature of 900° C. to 1000° C. (e.g. 950° C.) at a value of 4.2 (° C./min) or higher (e.g. 4.2° C./min). The control of the cooling rate CR is performed by adjusting the cooling capacity of the cooling jacket 14.

On the other hand, the nitrogen doping amount N and the solution oxygen concentration Oi are controlled to be values according to the respective requirements.

This makes it possible to reliably decrease the SSD density on the surface of an annealed wafer with a diameter of 300 mm to 0.15/cm² or lower (corresponding to 100 or less defects on the surface of an annealed wafer with a diameter of 300 mm) as long as the nitrogen concentration and the oxygen concentration are adjusted in ordinary ranges, specifically, the nitrogen doping amount N is adjusted in a range of 5 (×10¹⁴ atoms/cm³; the maximum value in the range of the nitrogen concentration N on the vertical axis) or lower and the oxygen concentration Oi is adjusted in a range of 14 (×10¹⁷ atoms/cm³; the maximum value in the range of the oxygen concentration Oi on the horizontal axis) or lower.

According to this Example 5, the cooling rate CR can be fixed to a same value. Therefore, particulars of the control of the cooling rate CR need not be changed for each of the requirements of the quantity of SSDs, the solution oxygen concentration, and the nitrogen doping amount.

Example 6

Similarly to Example 4 described above, a cooling rate CR required to decrease the density of SSDs with a diameter of 140 nm or greater to 0.3/cm² or lower can be obtained by using the oxygen concentration Oi and the nitrogen concentration N as parameters on the basis of the equal cooling rate line L51, . . . shown FIG. 12.

A silicon single crystal 6 is normally pulled under crystal growth conditions in which the nitrogen doping amount N is 5 (×10¹⁴ atoms/cm³; the maximum value in the range of the nitrogen concentration N on the vertical axis) or lower, and the oxygen concentration Oi is 14 (×10¹⁷ atoms/cm³; the maximum value in the range of the oxygen concentration Oi on the horizontal axis). As seen from FIG. 11, the equal cooling rate line (the cooling rate corresponding to the maximum value on the horizontal axis and the maximum value on the vertical axis) is 2.8 (° C./min) when the nitrogen concentration N is 5 (×10¹⁴ atoms/cm³; the maximum value in the range of the nitrogen concentration N on the vertical axis) and the oxygen concentration Oi is 14 (×10¹⁷ atoms/cm³; the maximum value in the range of the oxygen concentration Oi on the horizontal axis).

Accordingly, in this Example 6, a silicon single crystal 5 is pulled while controlling the cooling rate CR at a temperature of 900° C. to 1000° C. (e.g. 950° C.) at a value of 2.8 (° C./min) or higher (e.g. 2.8° C./min). The control of the cooling rate CR is performed by adjusting the cooling capacity of the cooling jacket 14.

On the other hand, the nitrogen doping amount N and the solution oxygen concentration Oi are controlled to be values according to the respective requirements.

This makes it possible to reliably decrease the SSD density on the surface of an annealed wafer with a diameter of 300 mm to 0.3/cm² or lower (corresponding to 200 or less defects on the surface of an annealed wafer with a diameter of 300 mm) as long as the nitrogen concentration and the oxygen concentration are adjusted in ordinary ranges, specifically, the nitrogen doping amount N is adjusted in a range of 5 ($\times 10^{14}$ atoms/cm³; the maximum value in the range of the nitrogen concentration N on the vertical axis) or lower and the oxygen concentration Oi is adjusted in a range of 14($\times 10^{17}$ atoms/cm³; the maximum value in the range of the oxygen concentration Oi on the horizontal axis) or lower.

According to this Example 6, the cooling rate CR can be fixed to a same value. Therefore, particulars of the control of the cooling rate CR need not be changed for each of the requirements of the quantity of SSDs, the solution oxygen concentration, and the nitrogen doping amount.

Example 7

In Examples 5 and 6, the silicon single crystal 6 is pulled by obtaining a cooling rate CR at which the SSD density Nssd becomes 0.15/cm² or lower and 0.3/cm² or lower, respectively, when the nitrogen concentration N is 5E14 atoms/cm³ and the oxygen concentration Oi is 14E 17 atoms/cm³, from the SSD density estimating equation (Equation (1)), specifically from the equal cooling rate lines shown in FIGS. 11 and 12, and controlling the cooling rate so as to be the cooling rate CR thus obtained. However, according to the present invention, the target to which the SSD density Nssd is to be decreased is not limited to 0.15/cm² or lower, or 0.3/cm² or lower.

Accordingly, in a similar viewpoint to this, the present invention may be embodied such that the cooling rate CR is obtained to decrease the SSD density Nssd to a desired value or lower.

Specifically, the present invention may be embodied to pull a silicon single crystal 6 by preparing an equal cooling rate line where the SSD density Nssd becomes a desired value or lower similarly to the equal cooling rate lines shown in FIGS. 11 and 12; using this equal cooling rate line to obtain a cooling rate CR at which the SSD density Nssd becomes a desired value or less when the nitrogen concentration N is 5E14 atoms/cm³ or lower and the oxygen concentration Oi is 14E17 atoms/cm³ or lower; and controlling the cooling rate so as to attain the cooling rate CR thus obtained.

When an annealed wafer produced by each of the production methods of the Examples described above is measured in the DNN mode with the use of a commercially available Particle Counter SP1, it is found that the density of SSDs detected on the wafer surface has been decreased to a desired value or less. In the annealed wafers produced by the production methods of Examples 2, 3, and 5, in particular, the density of defects with a diameter of 140 nm or greater detected on the wafer surface is reliably decreased to 0.15/cm² or lower when measured in the DNN mode with the use of a commercially available Particle Counter SP1, showing a particularly high defect reduction effect.

Moreover, the oxygen concentration and the nitrogen concentration also satisfy the requirements. Further, the silicon single crystal 6 can be grown under growth conditions corresponding to the low V/G region (FIG. 1) desirable for annealed wafers.

According to this Example 7, a high-quality annealed wafer can be produced in a reliable manner.

Example 8

The silicon single crystal producing methods described in Examples 1 to 7 are production methods in which a silicon single crystal 6 is pulled and grown while controlling three parameters of the oxygen concentration Oi, the nitrogen concentration N, and the cooling rate CR to thereby decrease the quantity of deposits associated with oxygen and nitrogen and forming cores of SSDs, and thus to decrease the SSD density Nssd on the annealed wafer surface.

However, the SSD density Nssd on the annealed wafer surface can be equally reliably decreased by performing, after producing a silicon single crystal 6 without performing the control described above in the course of pulling and growing the silicon single crystal 6, an annealed wafer production method including a step of annealing a silicon wafer and a step of polishing the surface of the annealed wafer to a depth of at least 1 µm.

As described with reference to FIG. 15, it is known that the quantity of SSDs can be decreased to 30 (corresponding to 0.04/cm² in the surface density) by polishing the surface of an annealed wafer having a diameter of 300 mm to a depth of at least 1 µm.

Therefore, when the annealed wafer production method of this Example 8 including the steps of annealing a silicon wafer and polishing the annealed wafer surface to a depth of at least 1 µm is performed, and the surface of the annealed wafer is measured in the DNN mode with the use of a particle counter, it is found that the density of SSDs having a diameter of 140 nm or greater detected on the wafer surface is reliably decreased to 0.04/cm² or less. Thus, the present example exhibits a particular high SSD reduction effect.

Obviously, the silicon single crystal producing method according to any of Examples 1 to 7 may be embodied in combination with the annealed wafer producing method described in this Example 8.

The description of the Examples above has been made on the assumption that the density of deposits associated with oxygen and nitrogen and forming cores of SSDs is increased when a silicon wafer is annealed, and the description has been made that the quantity of SSDs is decreased by decreasing the density of deposits associated with oxygen and nitrogen either by controlling the three parameters of the oxygen concentration, the nitrogen concentration, and the cooling rate in the course of pulling and growing a silicon single crystal 6 before annealing or by polishing the silicon wafer after annealing the same.

It is believed however that the density (quantity) of deposits associated with oxygen and nitrogen and forming cores of SSDs is increased when an epitaxial growth layer is formed on a silicon wafer substrate, in the same manner as the silicon wafer is annealed. Therefore, the above-mentioned technique applicable to an annealed wafer may be applied to an epitaxial wafer. This means that it is also possible to decrease the quantity of SSDs generated after epitaxial growth by decreasing the density (quantity) of deposits associated with oxygen and nitrogen in the course of pulling and growing a silicon single crystal 6 before the epitaxial growth by controlling the three parameters of the oxygen concentration, the nitrogen concentration, and the cooling rate.

Although this embodiment has been described above on the assumption of a case in which a silicon single crystal 6 having a diameter of 300 mm is pulled and grown, the diameter size of the silicon single crystal 6 is not crucial to the present invention. The diameter size of the silicon single crystal 6 may be smaller than 300 mm (e.g. 200 mm), or greater than 300 mm, and the present invention may be applicable equally to all such silicon single crystals.

BRIEF DESCRIPTION OF THE DRAWINGS

FIGS. 5A to 5J are diagrams showing examples of SSDs observed on a wafer surface;

FIG. 6A is a graph showing relationship between oxygen concentration and quantity of SSDs, while FIG. 6B is a table corresponding to FIG. 6A;

FIG. 7 is a graph showing relationship between position of a silicon single crystal, oxygen concentration, and quantity of SSDs;

FIGS. 13A and 13B are diagrams showing results of MAG-ICS measurement of an annealed wafer surface, while

FIG. 16 is a table showing, for each test, relationship of an estimated SSD density of with a cooling rate, oxygen concentration, nitrogen concentration, and an actual SSD density corresponding thereto.

Figure 1:
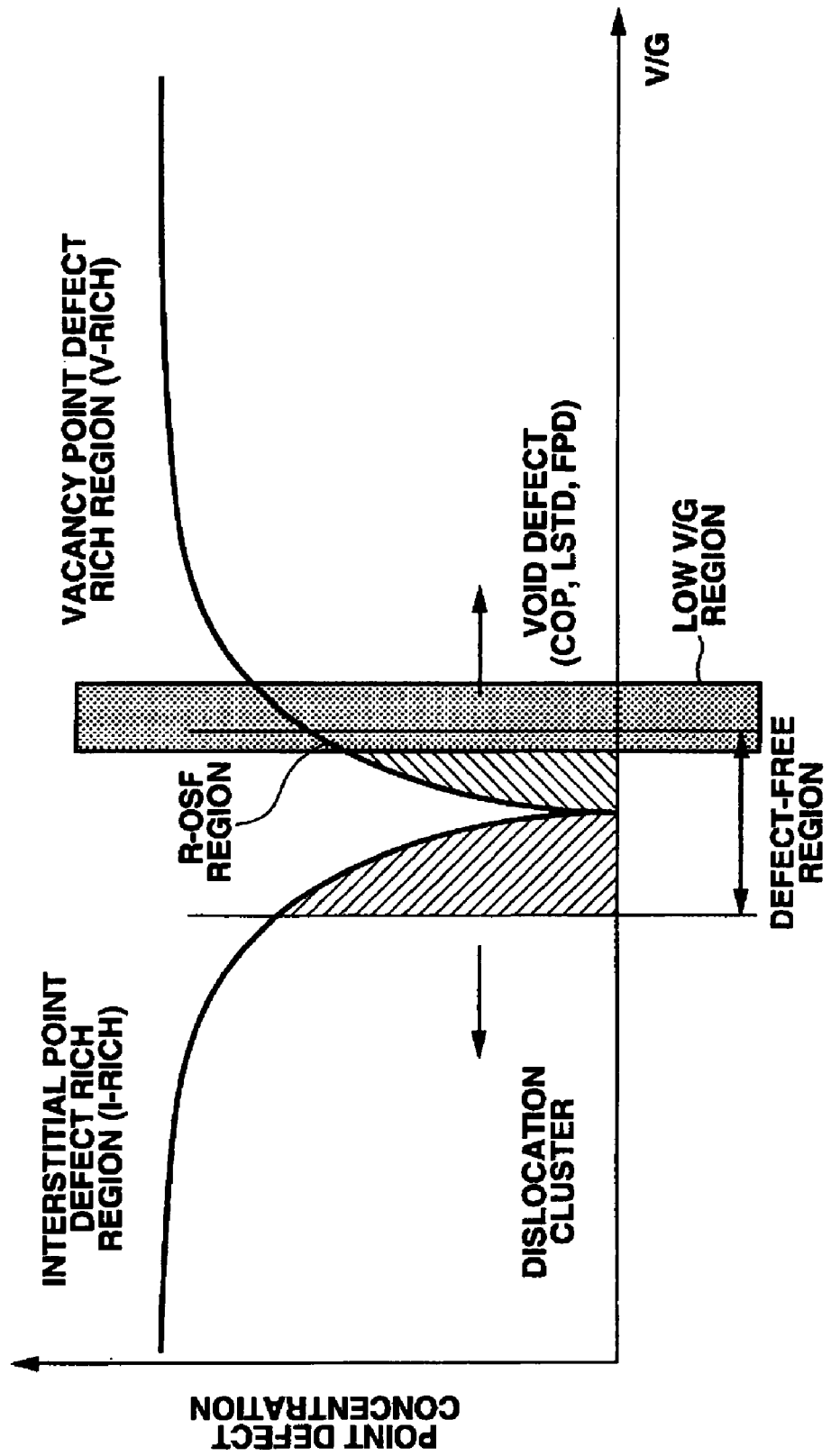
FIG. 1 is a graph showing relationship between growth conditions and point defect density, for explaining the low V/G region.
Figure 2:
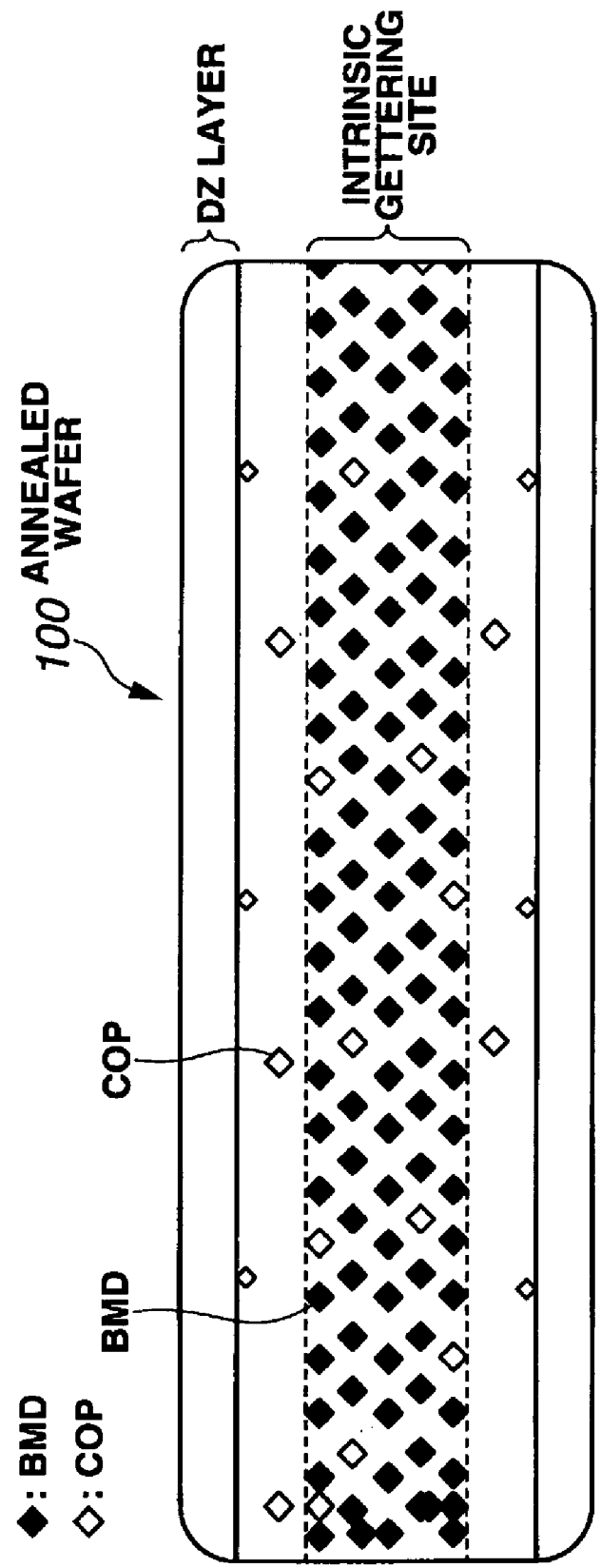
FIG. 2 is a cross-sectional view showing an ideal cross-sectional structure of an annealed wafer.
Figure 3:
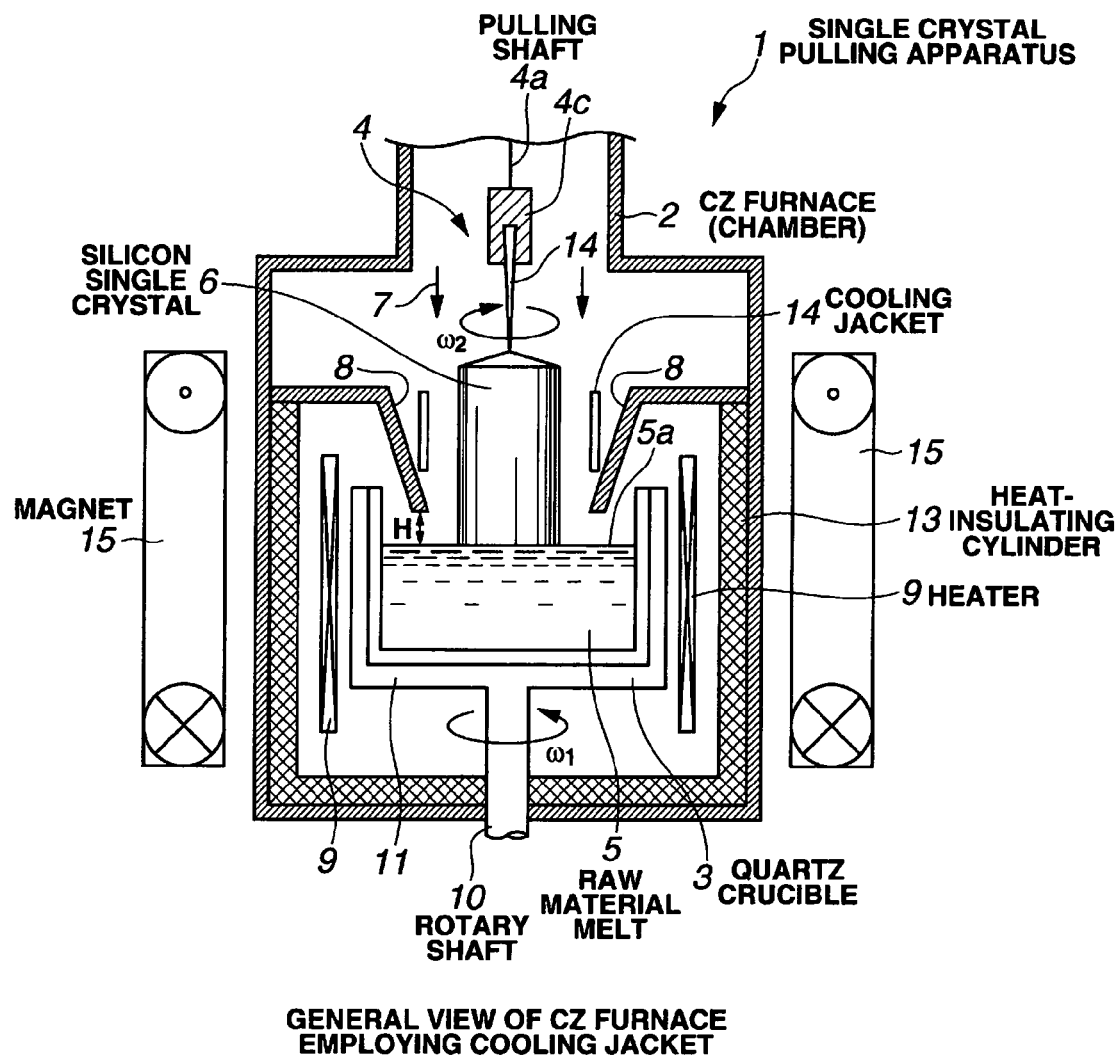
FIG. 3 is a cross-sectional view of an apparatus for producing a silicon single crystal, as viewed from a side.
Figure 4:
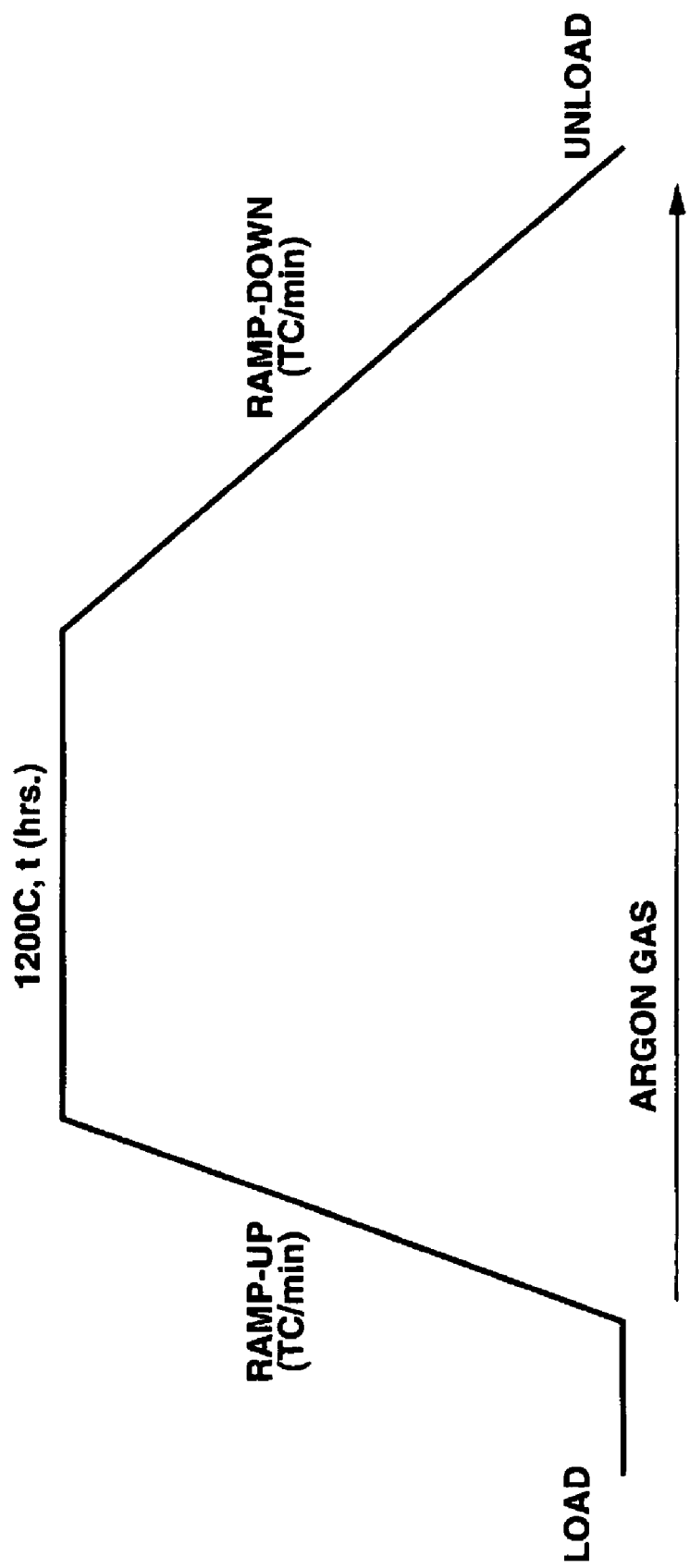
FIG. 4 is a diagram showing an annealing recipe.
Figures 6A, 6B:
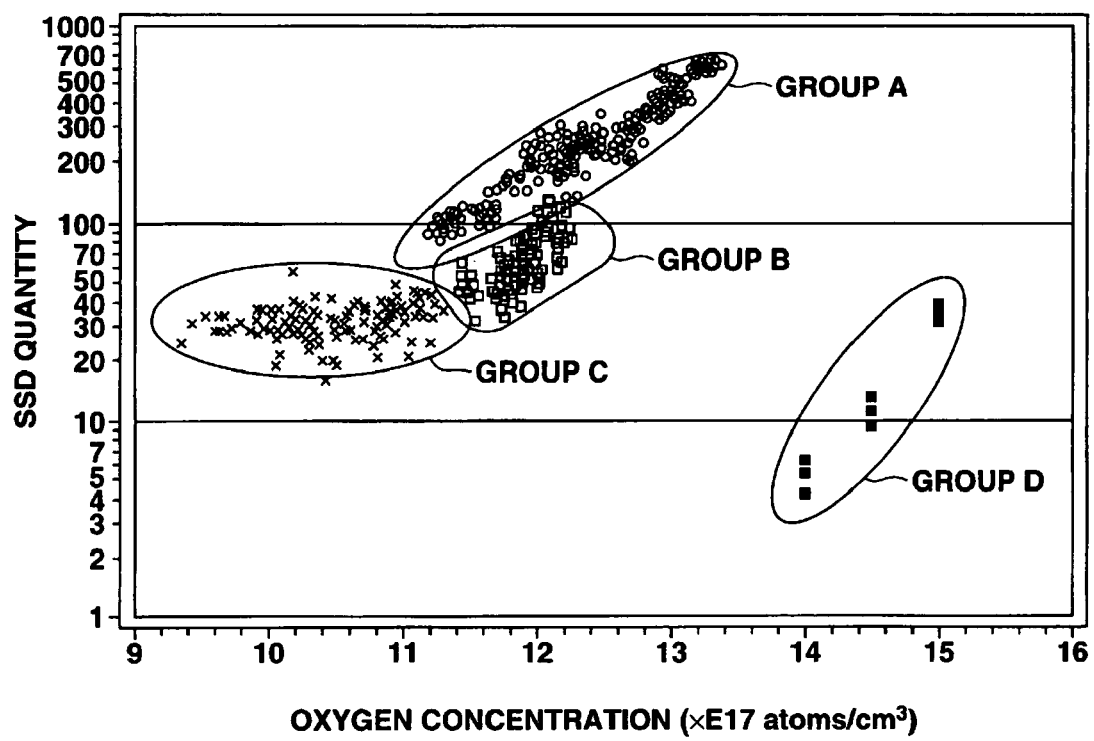
Figure 8:
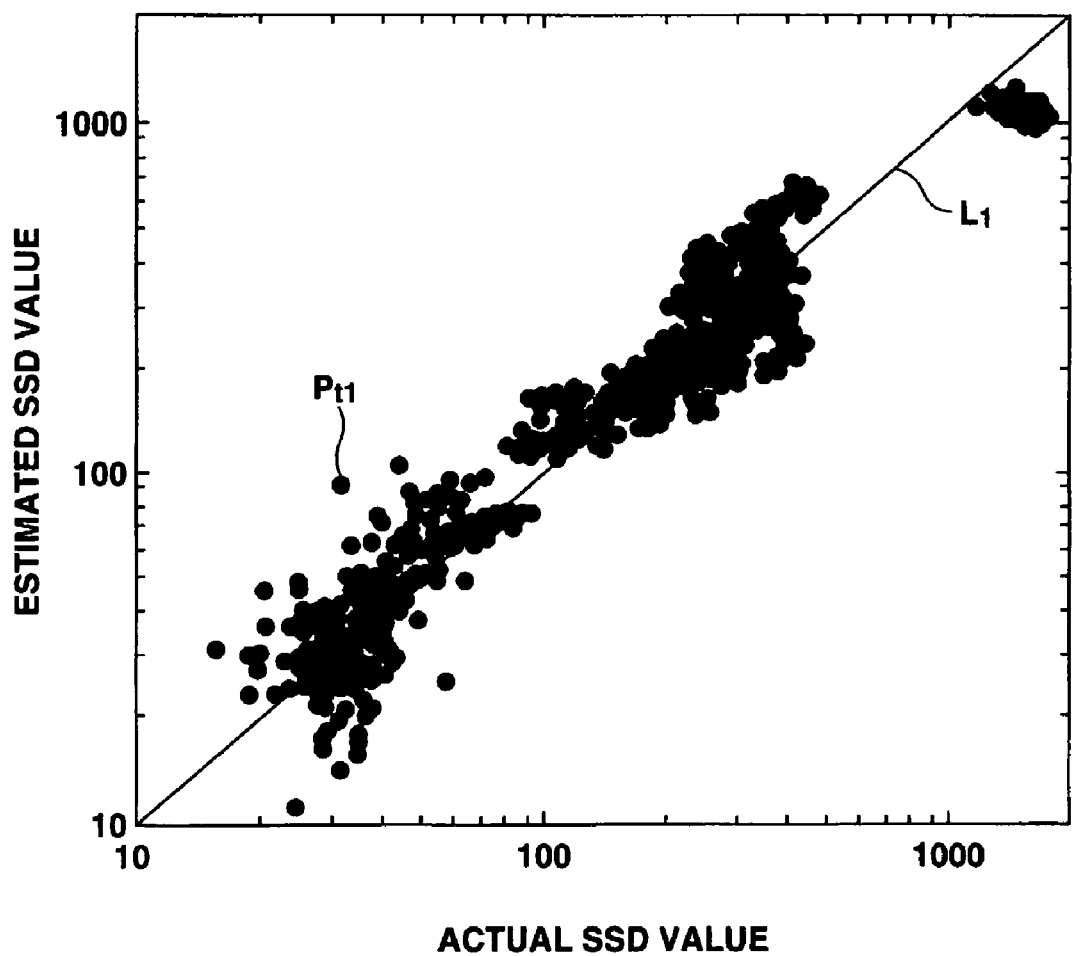
FIG. 8 is a graph showing relationship between actual quantity and estimated quantity of SSDs.
Figure 9:
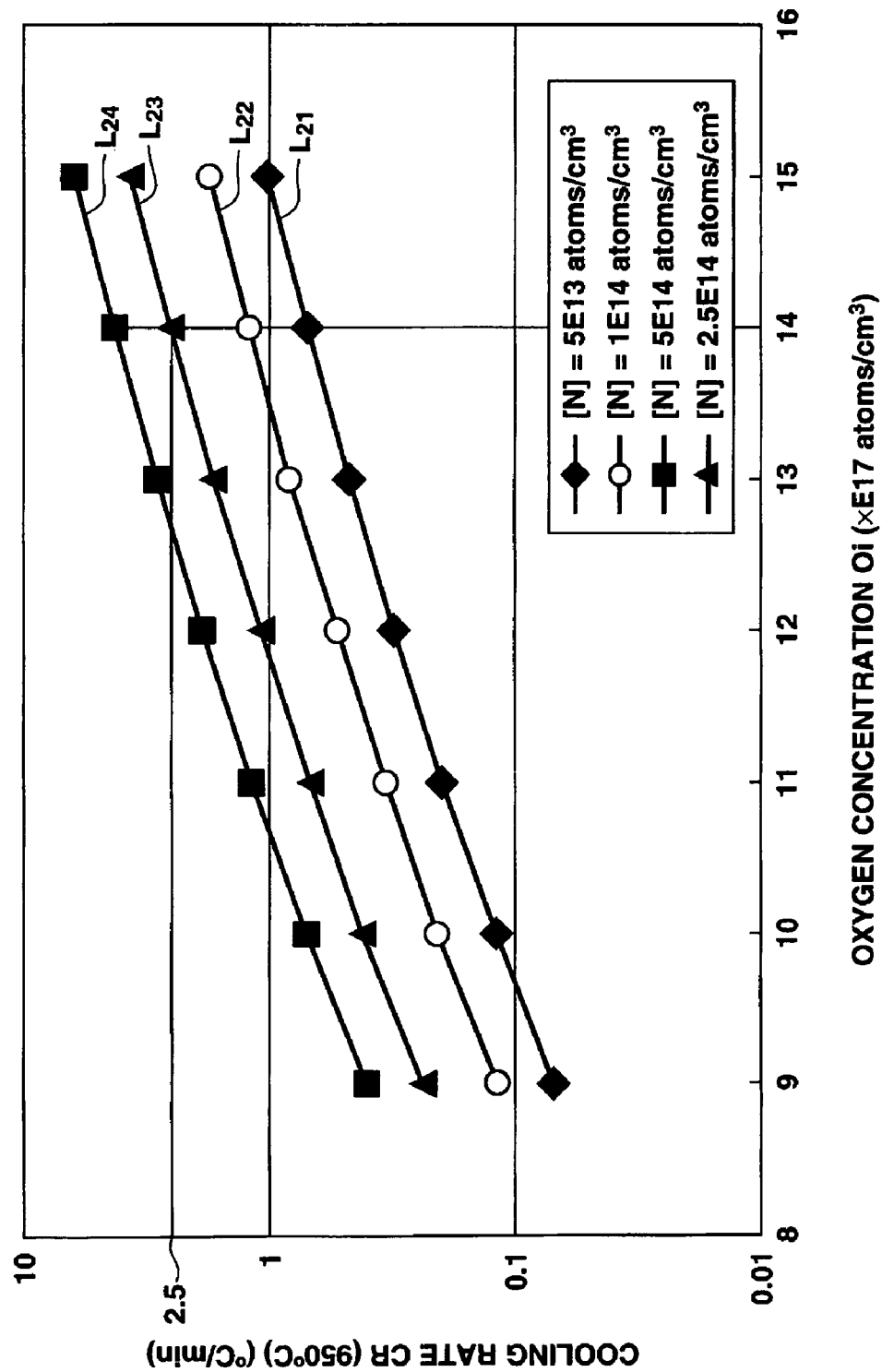
FIG. 9 is a graph showing relationship between oxygen concentration and cooling rate for each nitrogen concentration.
Figure 10:
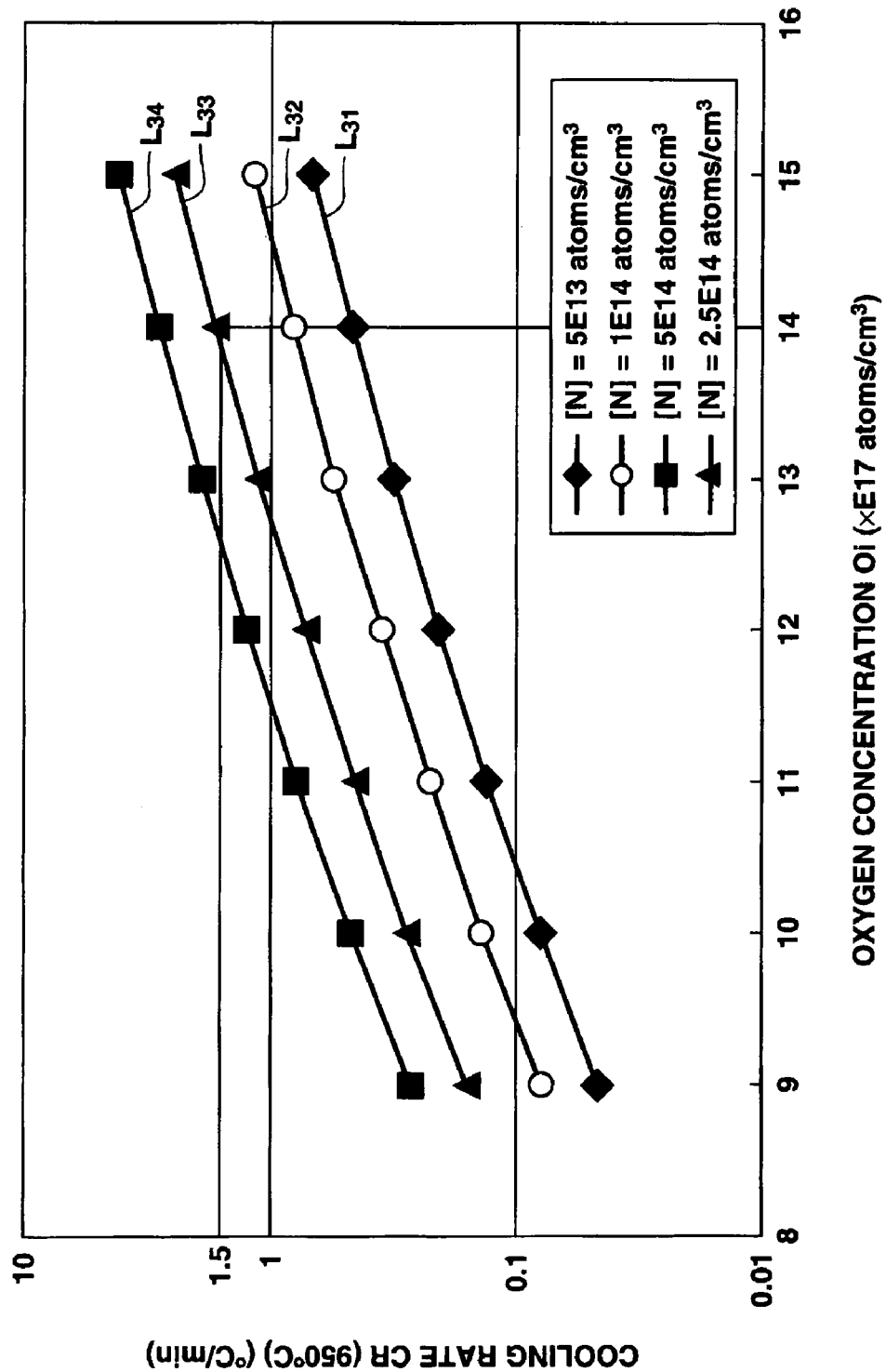
FIG. 10 is a graph showing relationship between oxygen concentration and cooling rate for each nitrogen concentration.
Figure 11:
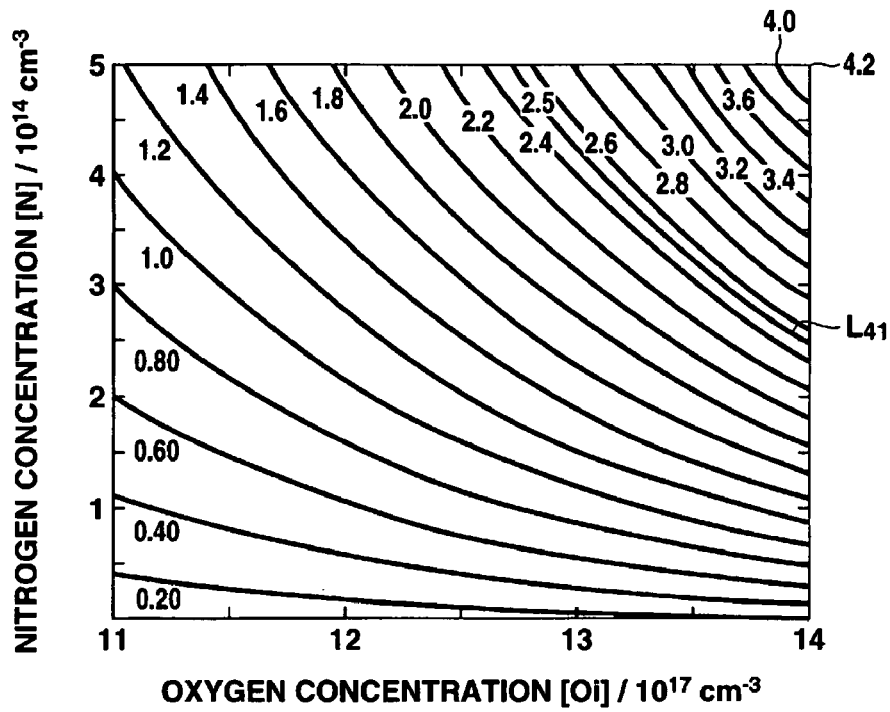
FIG. 11 is a graph showing equal cooling rate lines for reducing the quantity of SSDs to a predetermined value or lower while using oxygen concentration and nitrogen concentration as parameters.
Figure 12:
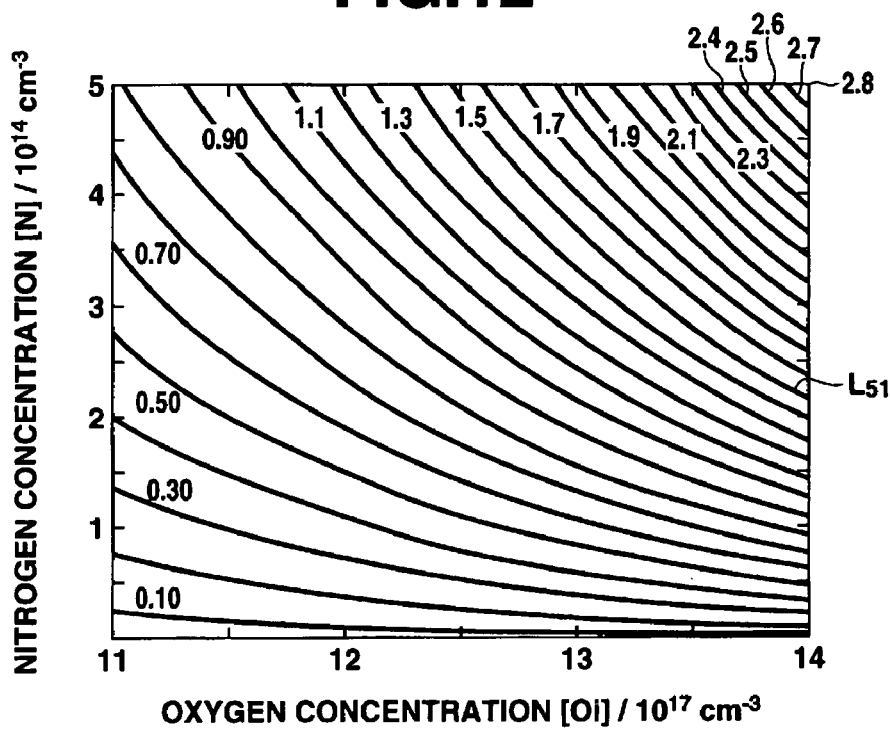
FIG. 12 is a graph showing equal cooling rate lines for reducing the quantity of SSDs to a predetermined value or lower while using oxygen concentration and nitrogen concentration as parameters.
Figure 13A:
Figure 13B:
Figure 13C:
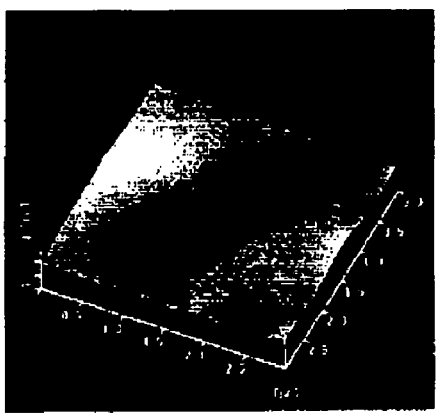
FIGS. 13C and 13D are diagrams showing results of AFM measurement of an annealed wafer surface.
Figure 13D:
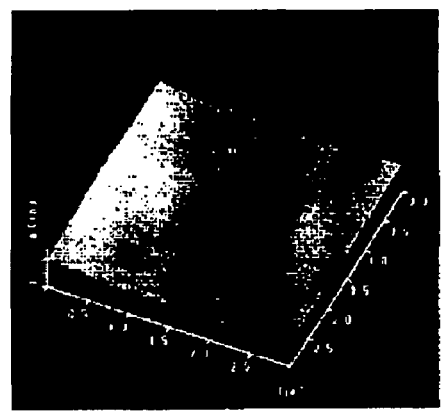
Figure 14:
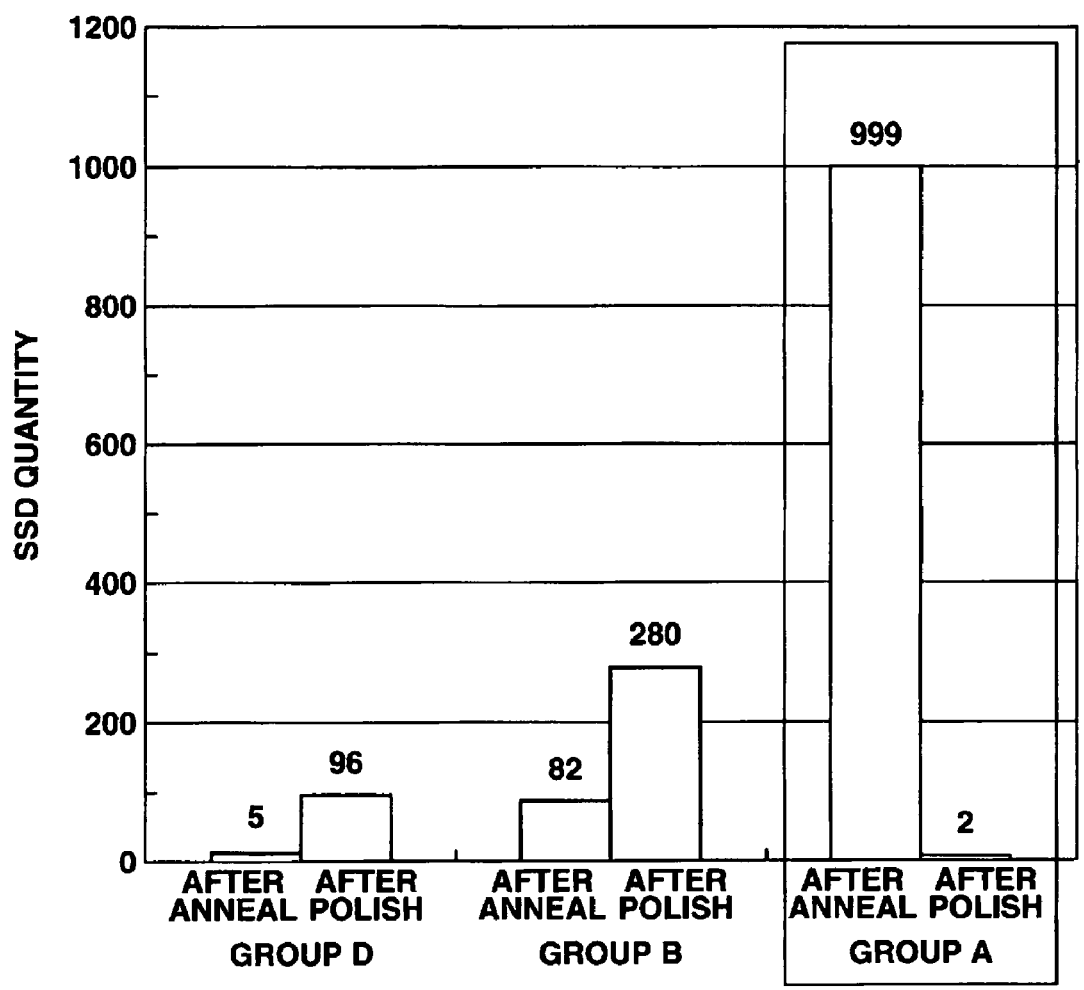
FIG. 14 is a graph showing, in comparison, a quantity of SSDs directly after annealing and a quantity of SSDs after polishing subsequent to annealing.
Figure 15:
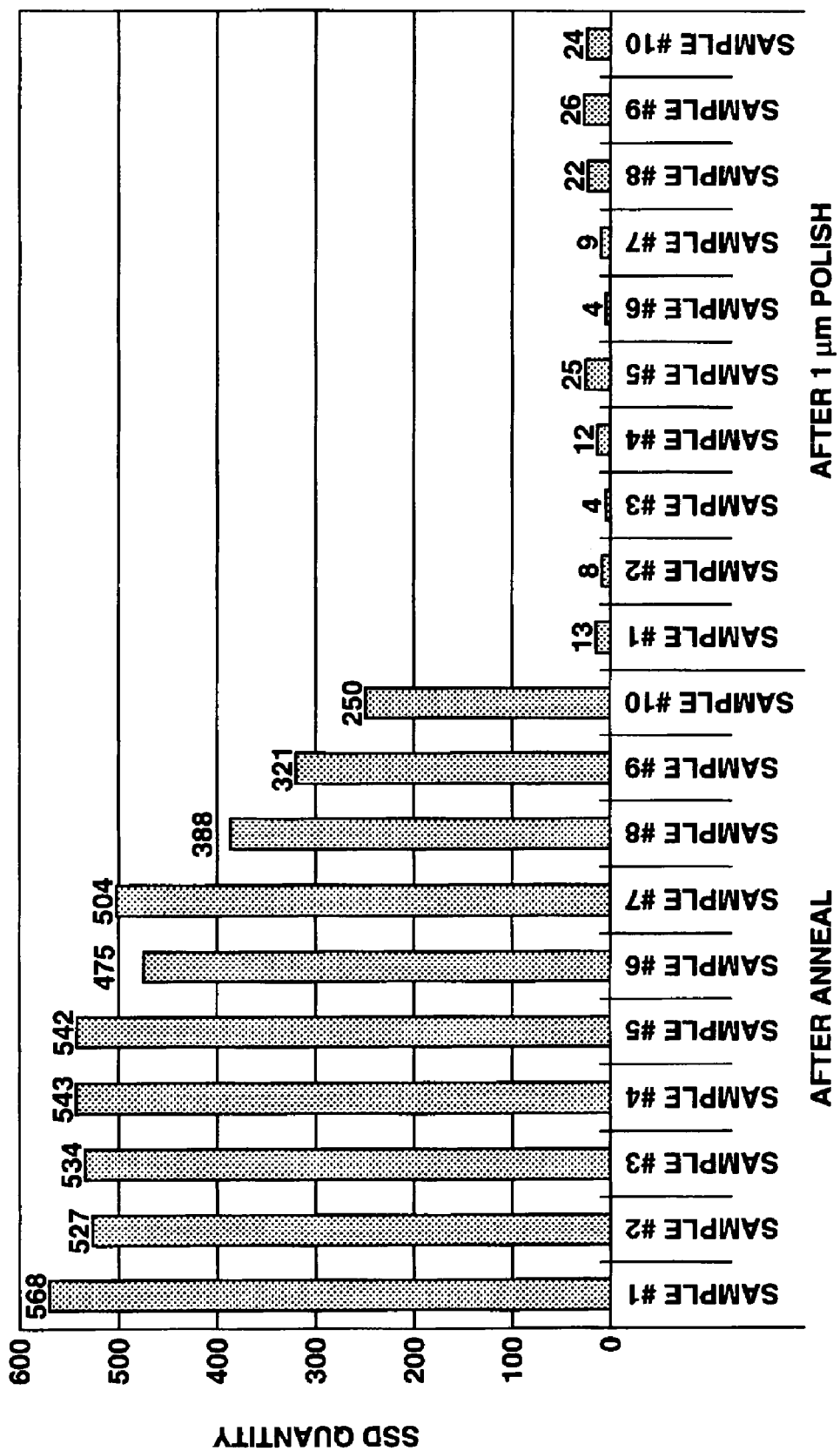
FIG. 15 is a graph showing, in comparison, a quantity of SSDs directly after annealing and a quantity of SSDs after polishing subsequent to annealing.
Figure 17:
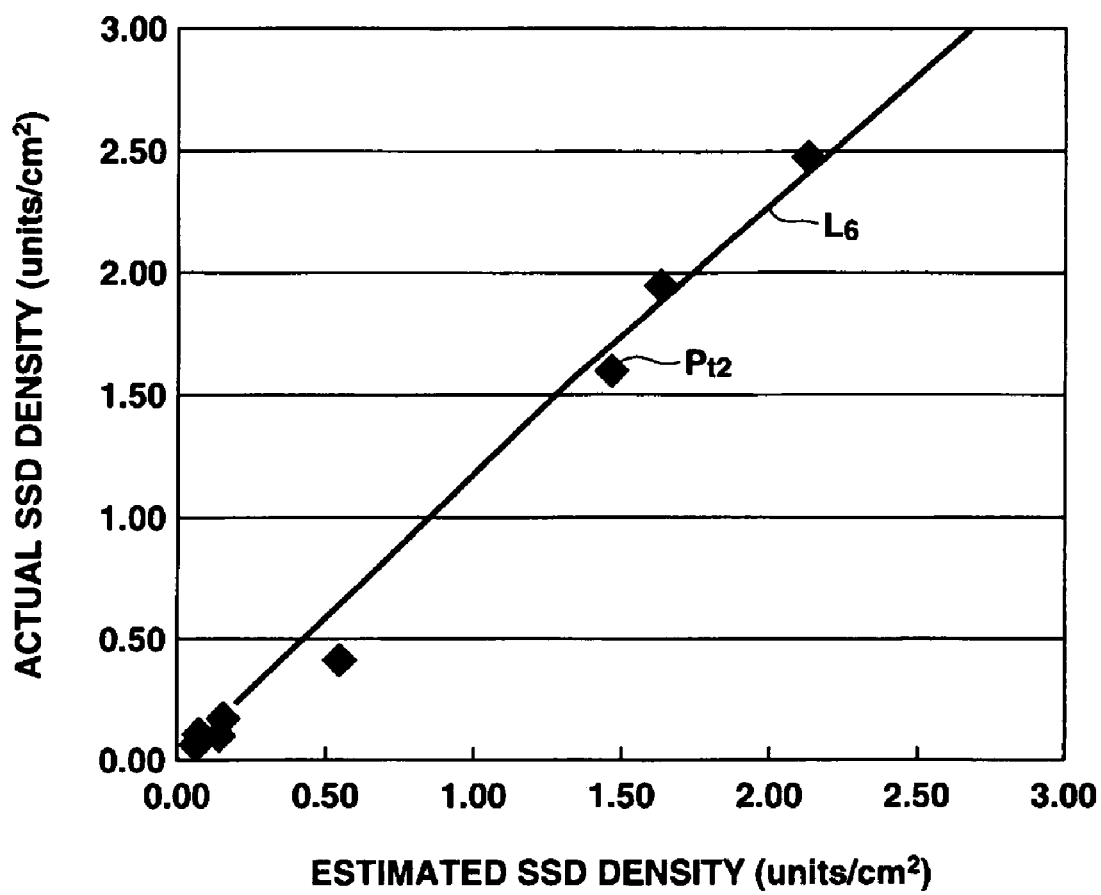
FIG. 17 is a graph showing relationship between the estimated SSD density and the actual SSD density shown in FIG. 16.

The invention claimed is:

1. A silicon single crystal producing method in which:
the density or quantity of SSDs (Surface Shallow Defects, or very wide and shallow recessed defects) generated on the surface of a wafer having a diameter of 300 mm or greater subjected to an annealing treatment is estimated by using a relational expression established among a density Nssd of the SSDs, oxygen concentration Oi within the silicon single crystal, nitrogen concentration N within the silicon single crystal, cooling rate CR at a predetermined temperature during the pulling of the silicon single crystal; and a constant A, the relational expression being represented by:

$Nssd = A[Oi]^l[N]^m[CR]^n$ (where $l>0$, $m>0$, and $n<0$); and the silicon single crystal having a diameter of 300 mm or greater is pulled under such crystal growth conditions of the oxygen concentration, the nitrogen concentration, and the cooling rate in the predetermined temperature range that the estimated SSD density is obtained.

2. The silicon single crystal producing method of claim 1, wherein the silicon single crystal having a diameter of 300 mm or greater is pulled with the nitrogen doping amount set in a range of 1E13 to 2.5E14 atoms/cm3, the solution oxygen concentration set in a range of 11E17 to 14E17 atoms/cm3, and the cooling rate in a temperature range of 900° C. to 1000° C. set to 2.5° C./min or higher.

3. The silicon single crystal producing method of claim 1, wherein the silicon single crystal having a diameter of 300 mm or greater is pulled with the nitrogen doping amount set in a range of 1E13 to 2.5E14 atoms/cm$^3$, the solution oxygen concentration set in a range of 11E17 to 14E17 atoms/cm$^3$, and the cooling rate in a temperature range of 900° C. to 1000° C. set to 1.5° C./min or higher.

4. The silicon single crystal producing method of claim 1, wherein the silicon single crystal having a diameter of 300 mm or greater is pulled while controlling the cooling rate such that the cooling rate in a temperature range of 900° C. to 1000° C. is 4.2° C./min or higher when the nitrogen concentration is 5E14 atoms/cm3 or lower and the oxygen concentration is 14E17 atoms/cm3 or lower.

5. The silicon single crystal producing method of claim 1, wherein the silicon single crystal having a diameter of 300 mm or greater is pulled while controlling the cooling rate such that the cooling rate in a temperature range of 900° C. to 1000° C. is 2.8° C./min or higher when the nitrogen concentration is 5E14 atoms/cm3 or lower and the oxygen concentration Oi is 14E17 atoms/cm3 or lower.

6. The silicon single crystal producing method according to claim 1, wherein the cooling rate CR is obtained from the equation in claim 1 such that the SSD density or quantity Nssd becomes equal to or less than a desired value when the nitrogen concentration N is 5E14 atoms/cm$^3$ or lower and the oxygen concentration Oi is 14E17 atoms/cm$^3$ or lower; and
a silicon single crystal is pulled while controlling the cooling rate to be the obtained cooling rate CR.

7. The silicon single crystal producing method according to claim 1, wherein cooling means for cooling a silicon single crystal is provided within a furnace in which processing to pull the silicon single crystal from a melt is performed, and the cooling rate is controlled by using the cooling means.

8. A method for producing a silicon single crystal comprising the steps of:
determining three parameters including an SSD density from among a density Nssd of SSDs, oxygen concentration Oi within a silicon single crystal, nitrogen concentration N within the silicon single crystal, and cooling rate CR at a predetermined temperature during pulling of the silicon single crystal;
determining the remaining parameter by using the selected three parameters and a relational expression represented by:

$Nssd = A[Oi]^l[N]^m[CR]^n$ (where $l>0$, $m>0$, and $n<0$)

Pulling a silicon single crystal having a diameter of 300 mm or greater under crystal growth conditions of the determined oxygen concentration Oi, the nitrogen concentration N, and the cooling rate CR.

* * * * *